US011101241B2

(12) United States Patent
Nakamura

(10) Patent No.: US 11,101,241 B2
(45) Date of Patent: Aug. 24, 2021

(54) SEMICONDUCTOR DEVICE HAVING TERMINALS AND SEMICONDUCTOR ELEMENTS ELECTRICALLY CONNECTED TO A RESPECTIVE SIDE SURFACE OF THE TERMINALS

(71) Applicant: FUJI ELECTRIC CO., LTD., Kawasaki (JP)

(72) Inventor: Hideyo Nakamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 44 days.

(21) Appl. No.: 16/429,877

(22) Filed: Jun. 3, 2019

(65) Prior Publication Data
US 2020/0013752 A1 Jan. 9, 2020

(30) Foreign Application Priority Data
Jul. 4, 2018 (JP) .............................. JP2018-127703

(51) Int. Cl.
*H01L 25/065* (2006.01)
*H01L 23/498* (2006.01)
(Continued)

(52) U.S. Cl.
CPC .......... *H01L 25/0655* (2013.01); *H01L 23/36* (2013.01); *H01L 23/3675* (2013.01);
(Continued)

(58) Field of Classification Search
CPC .............. H01L 25/0655; H01L 23/498; H01L 23/3675; H01L 25/18; H01L 25/072;
(Continued)

(56) References Cited

U.S. PATENT DOCUMENTS 9,312,192 B2    4/2016   Horio et al.
9,379,083 B2    6/2016   Iizuka et al.
(Continued)

FOREIGN PATENT DOCUMENTS

JP      10-094256 A     4/1998
JP      2007-067084 A   3/2007
(Continued)

OTHER PUBLICATIONS

Nashida, Norihiro et al. "All-SiC Module Technologies", 2012 vol. 85, No. 6, pp. 403-407 (Discussed in Patent Application Specification and accompanied by concise statement of relevance).
(Continued)

*Primary Examiner* — Steven H Loke
*Assistant Examiner* — Juanita B Rhodes

(57) ABSTRACT

The semiconductor device includes, on the cooling substrate, first main terminal, second main terminal, third main terminal, and fourth main terminal, each having a polygonal-shape. The first external-connection face on upper surface of the first main terminal is connected to positive electrode, and the fourth external-connection face on upper surface of the fourth main terminal is connected to negative electrode. First semiconductor element electrically connected between side surface of the first main terminal and side surface of the second main terminal, and second semiconductor element electrically connected between side surface of the third main terminal and side surface of the fourth main terminal are provided. The second main terminal and the third main terminal are disposed adjacent to each other while being separated, and the first main terminal and the fourth main terminal are disposed adjacent to each other while being separated.

19 Claims, 22 Drawing Sheets

(51) Int. Cl.
*H02M 7/00* (2006.01)
*H02M 7/5387* (2007.01)
*H01L 23/367* (2006.01)
*H01L 25/07* (2006.01)
*H01L 23/36* (2006.01)
*H01L 25/18* (2006.01)
*H01L 23/373* (2006.01)
*H02M 1/32* (2007.01)

(52) U.S. Cl.
CPC ........ *H01L 23/3735* (2013.01); *H01L 23/498* (2013.01); *H01L 25/072* (2013.01); *H01L 25/18* (2013.01); *H02M 1/327* (2021.05); *H02M 7/003* (2013.01); *H02M 7/5387* (2013.01)

(58) Field of Classification Search
CPC .... H01L 23/3735; H01L 23/36; H02M 7/003; H02M 7/5387; H02M 2001/327; H02M 1/327
See application file for complete search history.

(56) References Cited

U.S. PATENT DOCUMENTS

| | | |
|---|---|---|
| 9,385,061 B2 | 7/2016 | Nakamura et al. |
| 10,070,528 B2 | 9/2018 | Nakamura et al. |
| 2014/0346659 A1* | 11/2014 | Nakamura ............ H01L 23/043 257/704 |
| 2014/0361424 A1* | 12/2014 | Horio .................. H01L 25/0655 257/704 |
| 2014/0367736 A1* | 12/2014 | Iizuka ..................... H01L 24/02 257/133 |
| 2015/0223339 A1* | 8/2015 | Nakamura .......... H01L 23/3107 361/705 |
| 2017/0077044 A1* | 3/2017 | Soyano .................. H01L 23/48 |

FOREIGN PATENT DOCUMENTS

| | | |
|---|---|---|
| JP | 2007-067220 A | 3/2007 |
| JP | 2007-068302 A | 3/2007 |
| JP | 2018-037452 A | 3/2018 |
| WO | WO 2013/145619 A1 | 10/2013 |
| WO | WO 2014/061211 A1 | 4/2014 |

OTHER PUBLICATIONS

Kazuto Takao et al., "Ultra Low Inductance Power Module for Fast Switching SiC Power Devoces", Corporate Research & Development Center Toshiba Corporation, Kawasaki, Japan, Proceedings of the 27th International Symposium on Power Semiconductor Devices & IC's May 10-14, 2015, Kowloon Shangri-La, Hong Kong, 978-1-4799-6261, Jul. 2015, IEEE, pp. 313-316.

* cited by examiner

SEMICONDUCTOR DEVICE HAVING TERMINALS AND SEMICONDUCTOR ELEMENTS ELECTRICALLY CONNECTED TO A RESPECTIVE SIDE SURFACE OF THE TERMINALS

CROSS-REFERENCE TO RELATED APPLICATION

This application claims benefit of priority under 35 USC 119 based on Japanese Patent Application No. 2018-127703 filed on Jul. 4, 2018, the entire contents of which are incorporated by reference herein.

BACKGROUND OF THE INVENTION

1. Field of the Invention

The present invention relates to a semiconductor device that can be used as power electronics.

2. Description of the Related Art

N. Nashida et al. "All-SiC Module Technologies" (Fuji Electric Technical Journal, Vol. 85, No. 6, 2012, p. 403-407) discloses a semiconductor device which includes an insulating substrate having an electro-conductive pattern formed on one side and a heat-transfer pattern formed on the other side, a semiconductor chip mounted on the electro-conductive pattern, and a printed circuit board fixing post electrodes connected to the semiconductor chip and terminal pins connected to the electro-conductive pattern. Such a semiconductor device may be downsized due to decrease of the wiring path by using the post electrodes, and be capable of high-speed switching due to reduced inductance (see N. Nashida et al.).

However, along with the spread of high-speed switching devices using silicon carbide (SiC) or the like in recent years, an ultra-low-inductance package capable of further high-speed switching is required. Moreover, in a semiconductor device disclosed in WO 2014/061211, although using pin-like terminals as wirings to be connected to an external printed circuit board may be one of the factors for downsizing and low inductance, for example, there is a case where terminals having screw holes for connecting with a bus-bar, or a terminal plate, are required. When structures, such as the screw holes and the like, for connection with another conductor are added to the terminal of WO 2014/061211, inductance may be increased due to the extension of the internal wirings.

WO 2013/145619 discloses a semiconductor device which can be handled as one large-capability module having terminals for screwing by housing a plurality of semiconductor modules in a case connected to each other by a bus-bar. Thus, the semiconductor device can be dealt with screw tightening. However, since a structure for connecting the semiconductor modules and a structure for converting terminals are required, it is difficult to downsize the semiconductor device. In addition, since current can be distributed to the semiconductor modules, the inductance can be reduced. However, the inductance of the semiconductor device may not be necessarily an inverse multiple of the number of semiconductor modules due to the inductance of the wiring between modules.

Each of JP 2007-067084, JP 2007-067220, JP 2007-068302 and JP 2018-037452 discloses a power semiconductor device which includes a plurality of semiconductor chips, a first conductor joined to each positive electrode of the semiconductor chips, and a second conductor joined to each negative electrode of the semiconductor chips. On the other hand, JP H10-094256 discloses a power converter module which includes a cooling block, a plurality of semiconductor switching elements provided on both sides of the cooling block, and two conductors arranged so that each current in the conductors flows in a direction to mutually cancel the change in magnetic flux during switching at a symmetrical position across the cooling block. In such a structure, since there is an inductance for block wirings, the reduction in inductance as in WO 2014/061211 may be the limit. In addition, since the distance between the conductors is about the thickness of the semiconductor chip, it is difficult to route wirings of the gates and the auxiliary sources to prevent the problems of the insulation.

SUMMARY OF THE INVENTION

An aspect of the present invention inheres in a semiconductor device, including (a) a polygonal-shaped first main terminal having a first external-connection face connected to a positive electrode on a top surface, a first cooling face on a bottom surface, and a side surface, (b) a polygonal-shaped second main terminal having a second external-connection face on a top surface, a second cooling face on a bottom surface, and a side surface, (c) a first semiconductor element having a first principal surface and a second principal surface opposite to the first principal surface, the first principal surface is electrically connected to the side surface of the first main terminal, and the second principal surface being electrically connected to the side surface of the second main terminal, (d) a polygonal-shaped third main terminal having a third external-connection face on a top surface, a third cooling face on a bottom surface, and a side surface, (e) a polygonal-shaped fourth main terminal having a fourth external-connection face connected to a negative electrode on a top surface, a fourth cooling face on a bottom surface, and a side surface, (f) a second semiconductor element having a third principal surface and a fourth principal surface opposite to the third principal surface, the third principal surface being electrically connected to the side surface of the third main terminal, and the fourth principal surface being electrically connected to the side surface of the fourth main terminal, and (g) a cooling substrate having an upper surface to which the first cooling face, the second cooling face, the third cooling face, and the fourth cooling face are joined, wherein the second main terminal and the third main terminal are disposed adjacent to each other while being separated, and the first main terminal and the fourth main terminal are disposed adjacent to each other while being separated.

DETAILED DESCRIPTION

Figure 1:
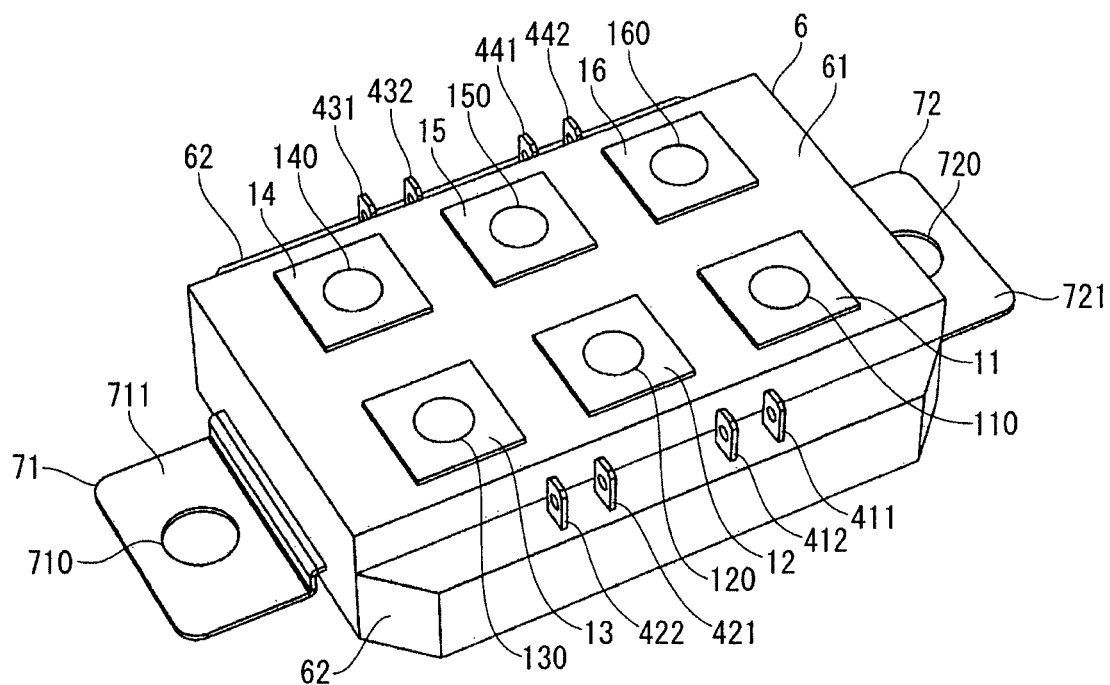
FIG. 1 is a schematic perspective view illustrating a basic configuration of a semiconductor device according to a first embodiment.

Hereinafter, first to fourth embodiments of the present invention will be described below with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top". Further, it is noted that a P-terminal denotes a positive-electrode terminal which is a power supply terminal of a high-potential side, an N-terminal denotes a negative-electrode terminal which is a power supply terminal of a low-potential side, and a U-terminal denotes a output-electrode terminal which is a terminal connected to a node between the high-potential side and the low-potential side.

First Embodiment

Figure 2:
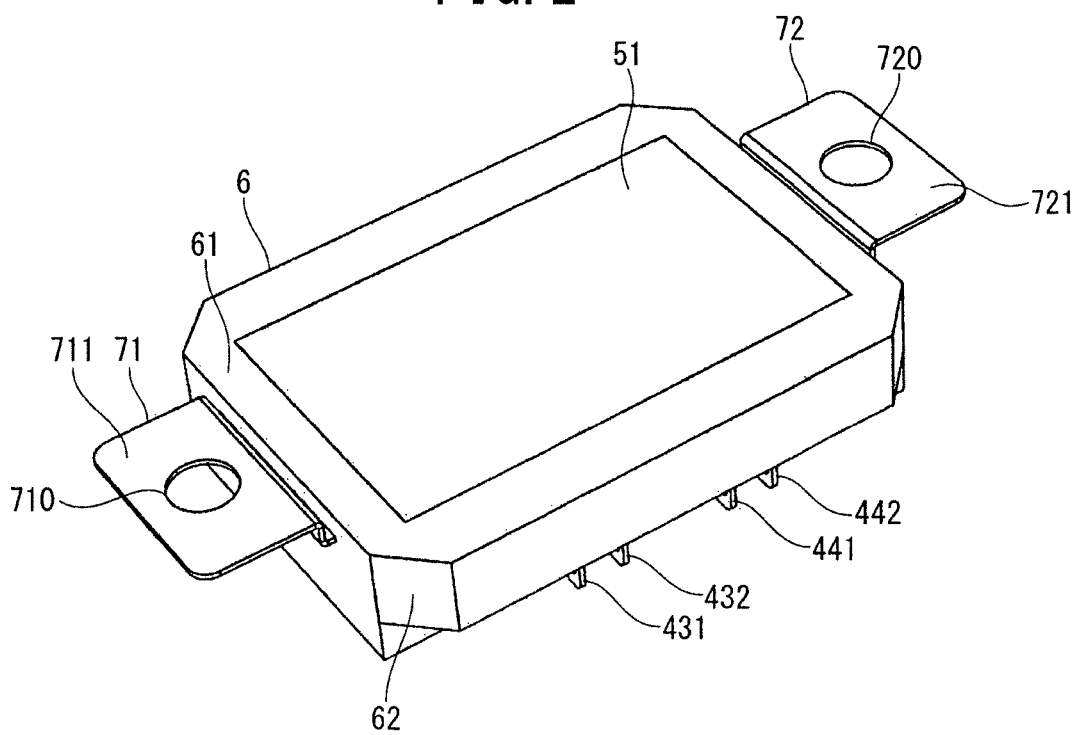
FIG. 2 is a perspective view of FIG. 1 as viewed from the back side.

A semiconductor device according to a first embodiment of the present invention has a plurality of main terminals 11, 12, 13, 14, 15, 16 and a plurality of auxiliary terminals 411, 412, 421, 422, 431, 432, 441, 442, as illustrated in FIGS. 1 and 2. Also, the semiconductor device according to the first embodiment has a rectangular parallelepiped case 6 housing the main terminals 11, 12, 13, 14, 15, 16 and the auxiliary terminals 411, 412, 421, 422, 431, 432, 441, 442 with respective parts exposed to the outside and attachment portions 71, 72 for attaching the case 6 to another. The shape of the case 6 is not limited to a rectangular shape.

The case 6 is formed by molding using an insulating resin material or the like. The case 6 has a rectangular parallelepiped main body portion 61 and two square columnar auxiliary portions 62 jointed to a pair of side surfaces of the main body portion 61. In an upper surface of the main body portion 61, upper surfaces of the polygonal columnar, for example, block-shaped, main terminals 11, 12, 13, 14, 15, 16 are exposed. In a lower surface of the main body portion 61, a surface of the heat-transfer plate 51 which transfers the internal heat to the outside, is exposed. Each of the two auxiliary portions 62 has an upper surface having a height lower than the top surface of the main body portion 61, and a lower surface which is continuous with the lower surface of the main body portion 61 and implements a bottom surface of the case 6 together with the lower surface of the main body portion 61.

The attachment portions 71, 72 are plate-like metal fittings that project outward from both end faces in a longitudinal direction of the main body portion 61. The attachment portions 71, 72 have flat portions 711, 721 along a plane formed by the lower surface of the main body portion 61, and through holes 710, 720 penetrating from a first main surface to a second main surface of the flat portions 711, 721, respectively. In the semiconductor device according to the first embodiment, for example, by screwing such that the through holes 710, 720 are aligned with the screw holes of another cooling device, such as a fin, a heat sink or the like, and tightening the flat portions 711, 721 to the screw head, the heat-transfer plate 51 is fixed in contact with the cooling device.

Figure 3:
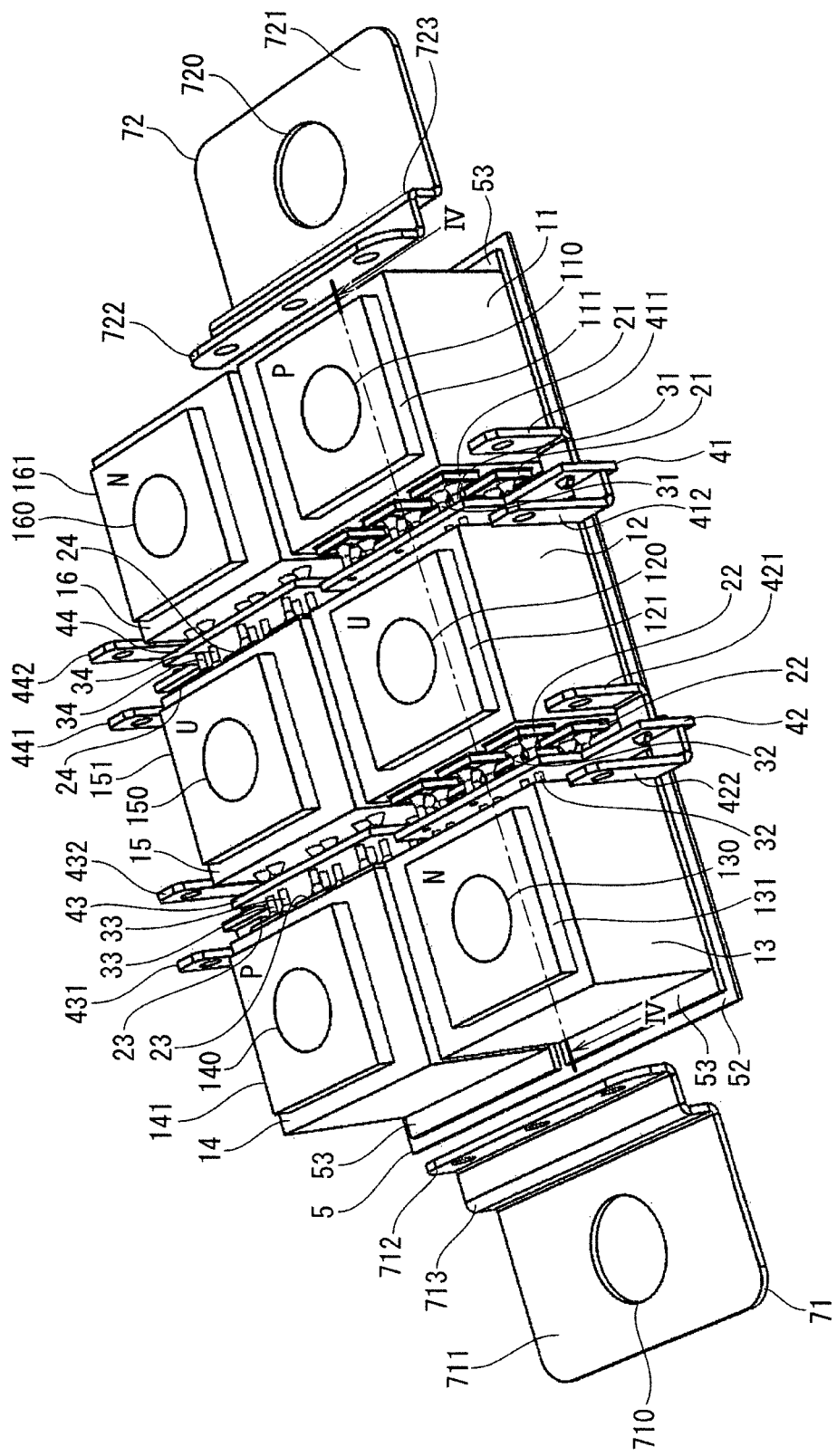
FIG. 3 is a perspective view illustrating an internal configuration of the semiconductor device according to the first embodiment.

As illustrated in FIG. 3, the attachment portions 71, 72 further include embedding portions 712, 722 embedded in and fixed to both end faces in the longitudinal direction of the case 6, and step portions 713, 723 lied between the flat portions 711, 721 and the embedding portions 712, 722. The step portions 713, 723 hold the flat portions 711, 721 in parallel to a plane formed by the lower surface of the main body portion 61.

The main terminals 11, 12, 13, 14, 15, 16, formed to be exposed from the upper surface, are in a rectangular parallelepiped block-shape having screw-holes 110, 120, 130, 140, 150, 160, each of which is a structure for connection with another conductor, such as a bus-bar and the like, respectively. The auxiliary terminals 411, 412, 421, 422, 431, 432, 441, 442 are terminal plates which respectively project upward from the upper surfaces of the two auxiliary portions 62, and have through holes formed in regions exposed to the outside, respectively.

In the lower row of the perspective view of FIG. 3, a first P-terminal (first main terminal) 11, a first U-terminal (second main terminal) 12, and a first N-terminal (fifth main terminal) 13 are arranged in a P-U-N topology. In the upper row of the perspective view in FIG. 3, a second P-terminal (sixth main terminal) 14, a second U-terminal (third main terminal) 15, and a second N-terminal (fourth main terminal) 16 are arranged in a P-U-N topology. The first P-terminal (first main terminal) 11 is separated near the second N-terminal (fourth main terminal) 16 and the first N-terminal (fifth main terminal) 13 is separated near the second P-terminal (sixth main terminal) 14. Further, the main terminals 11, 12, 13, 14, 15, 16 have mesa portions (external-connection faces) 111, 121, 131, 141, 151, 161, which are formed to be a higher level in height than the other portions, so that upper surfaces of the mesa portions 111, 121, 131, 141, 151, 161 are exposed from the upper surface of the case 6 while being held inside the case 6, respectively.

The main terminals 11, 12, 13, 14, 15, 16 are made of a material having high thermal conductivity, for example, a metallic material and the like containing copper (Cu). The screw holes 110, 120, 130, 140, 150, 160 may be formed by direct screwing when the main terminals 11, 12, 13, 14, 15, 16 are made of Cu. Also, in each of the screw holes 110, 120, 130, 140, 150, 160, a threaded insert, such as a helical insert, an E-sert (registered trademark), a nut, an internally-threaded pipe and the like, may be embedded to improve mechanical strength.

The semiconductor device according to the first embodiment further includes: a first structure, which is a composite of first semiconductor elements 21, first terminal pins 31 and a first circuit-board 41, disposed between the first P-terminal 11 and the first U-terminal 12 at the lower right of FIG. 3; a second structure, which is a composite of third semiconductor elements 22, third terminal pins 32 and a third circuit-board 42, disposed between the first U-terminal 12 and the first N-terminal 13 at the lower left side of FIG. 3; a third structure, which is a composite of fourth semiconductor elements 23, fourth terminal pins 33 and a fourth circuit-board 43, disposed between the second P-terminal 14 and the second U-terminal 15 at the upper left side of FIG. 3; and a fourth structure, which is a composite of second semiconductor elements 24, second terminal pins 34 and a second circuit-board 44, disposed between the second U-terminal 15 and the second N-terminal 16 at the upper right of FIG. 3. In addition, the semiconductor device according to the first embodiment further includes a rectangular-flat-shaped cooling substrate 5 on which the main terminals 11, 12, 13, 14, 15, 16 are mounted. The main terminals 11, 12, 13, 14, 15, 16 are separated from one another so as to be arranged in a 3×2 two-dimensional matrix on the cooling substrate 5.

Figure 4:
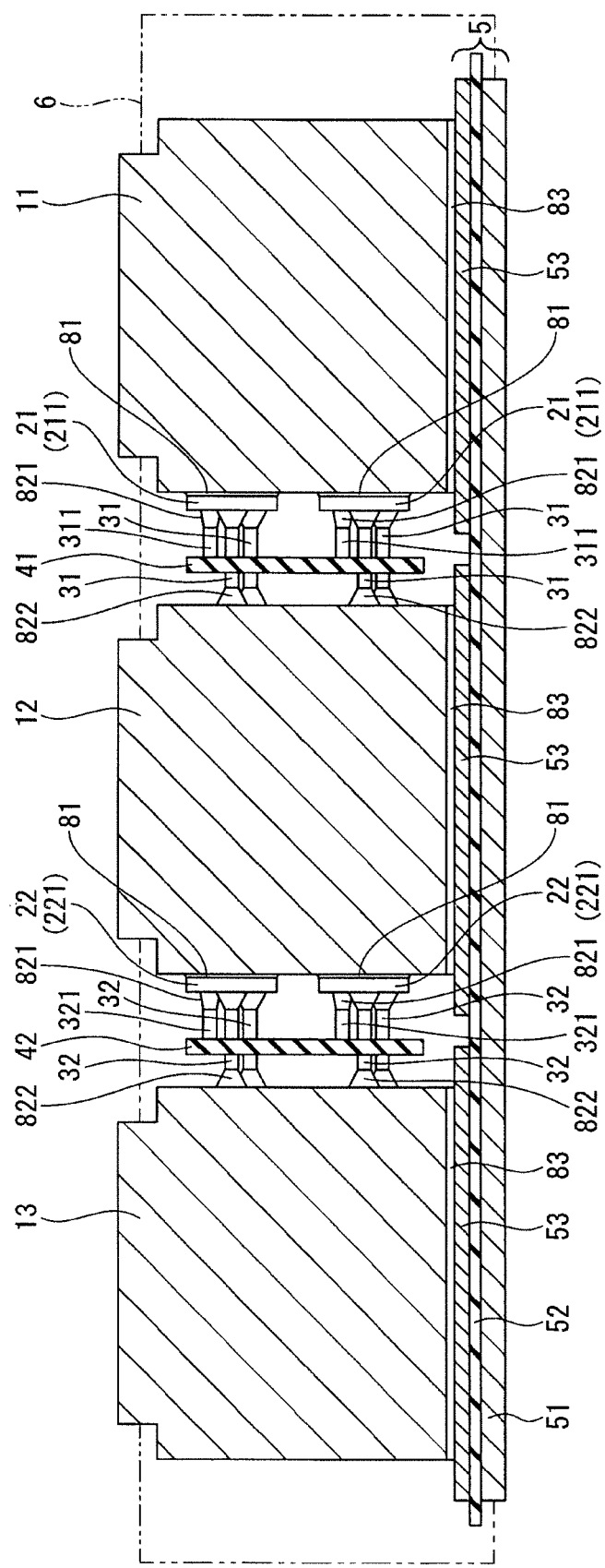
FIG. 4 is a cross-sectional view as seen from the IV-IV direction of FIG. 3.

As illustrated in the cross sectional view of FIG. 4, the cooling substrate 5 includes a rectangular-flat-shaped insulating substrate 52, a rectangular-flat-shaped heat-transfer plate 51 disposed on a lower surface of the insulating substrate 52, and a plurality of terminal patterns 53 arranged on an upper surface of the insulating substrate 52. Each of the terminal patterns 53 is arranged on the upper surface of the insulating substrate 52 as a rectangular pattern so as to correspond to each of the main terminals 11, 12, 13, 14, 15, 16. The heat-transfer plate 51 and the terminal patterns 53 are made of a material having high thermal conductivity, for example, a metallic material and the like containing Cu. The insulating substrate 52 is made of an insulating material, such as a synthetic resin, a ceramics or the like. Each lower surface of the main terminals 11, 12, 13, 14, 15, 16, served as a cooling surface, is mounted on each upper surface of the terminal patterns 53 of the cooling substrate 5.

The cooling substrate 5 is, for example, a direct copper joining (DCB) substrate in which copper is eutectically bonded to the surface of a ceramic substrate, and an active metal brazing (AMB) substrate in which a metal is disposed on the surface of a ceramic substrate by an AMB method, and the like may be adopted. For a material of the ceramic substrate, such as silicon nitride ($Si_3N_4$), aluminum nitride (AlN), alumina. ($Al_2O_3$) and the like may be adopted. The thickness of the heat-transfer plate 51 and the terminal patterns 53 may be determined to be, for example, about 0.5 mm to 1.5 mm in consideration of heat conduction, stress, manufacturing cost and the like. The cooling substrate 5 may have a joining material between the heat transfer plate 51 and the insulating substrate 52 and between the terminal pattern 53 and the insulating substrate 52.

As illustrated in FIG. 3, the first structure (21, 31, 41) implements a hybrid circuit having the plural first semiconductor elements 21, the plural first terminal pins 31, and a first circuit-board 41. The second structure (22, 32, 42) implements a hybrid circuit having the plural third semiconductor elements 22, the plural third terminal pins 32, and a third circuit-board 42. The third structure (23, 33, 43) implements a hybrid circuit having the plural fourth semiconductor elements 23, the plural fourth terminal pins 33, and a fourth circuit-board 43. The fourth structure (24, 34, 44) implements a hybrid circuit having the plural second semiconductor elements 24, the plural second terminal pins 34, and a second circuit-board 44.

The first P-terminal (first main terminal) 11, has a first mounting face for mounting the first semiconductor elements 21, a first cooling face joined to the cooling substrate 5, the first external-connection face 111 provided on the upper face of the first P-terminal 11, and a first opposing face opposed to the second N-terminal 16. Since FIG. 3 exemplifies the rectangular-parallelepiped first P-terminal 11, the first mounting face and the first cooling face are orthogonal to each other. However, the first mounting face and the first cooling face do not necessarily have to be strictly orthogonal to each other. At least the first mounting face and the first cooling face may be set to faces of different orientations so long as the first P-terminal 11 has a polygonal-shape. For example, the first P-terminal 11 may be in a parallelepiped block-shape.

Each of the first semiconductor elements 21 is a vertical semiconductor chip having a main current path from a first principal surface, which is joined to the first mounting face of the first P-terminal 11, to an opposite second principal surface. Each end of the first terminal pins 31 is connected to any one of second main electrodes in the second principal surfaces of the first semiconductor elements 21. The first circuit-board 41 is disposed along the first mounting face which is a side face of the first P-terminal 11, and holds each of the first terminal pins 31 perpendicularly to the first mounting face.

The first U-terminal 12, or the second main terminal 12, has: a first connection face which is a side surface facing the first mounting face of the first P-terminal 11 via the first circuit-board 41 and joins the other ends of the first terminal pins 31; a second cooling face joined to the cooling substrate 5; the second external-connection face 121 provided on the upper surface of the first U-terminal 12; a second opposing face which is a side surface facing the second U-terminal 15, and a third mounting face which is a side surface facing in the opposite direction of the first connection face. Since FIG. 3 exemplifies the rectangular parallelepiped first U-terminal 12, the first connection face and the second cooling face are orthogonal to each other. However, the first connection face and the second cooling face do not necessarily have to be strictly orthogonal. At least the first connection face and the second cooling face may be set to faces of different orientations so long as the first U-terminal 12 has a polygonal-shape. For example, the first U-terminal 12 may be in a parallelepiped block-shape.

Each of the third semiconductor elements 22 has a main current path from a first principal surface joined to the third mounting face which is a side face of the first U-terminal 12, to a second principal surface on an opposite side of the first principal surface. Each end of the third terminal pins 32 is connected to any one of the second principal surfaces of the third semiconductor elements 22. The third circuit-board 42 is disposed along the third mounting face of the first U-terminal 12 and holds each of the third terminal pins 32 perpendicularly to the third mounting face.

The first N-terminal 13, or the fifth main terminal 13, has: a third connection face which faces the first mounting face of the first U-terminal 12 via the third circuit-board 42 and joins the other ends of the third terminal pins 32; a fifth cooling face joined to the cooling substrate 5; the fifth external-connection face 131 provided on the upper surface of the first N-terminal 13; and a fifth opposing face facing the second P-terminal 14. Although FIG. 3 exemplifies the rectangular parallelepiped first N-terminal 13, the first N-terminal 13 may be in a parallelepiped block-shape.

The second P-terminal 14, or the sixth main terminal 14, has: the fourth mounting face facing the fourth connection face which is a side surface of the second U-terminal 15; a sixth cooling face joined to the cooling substrate 5; the sixth external-connection face 141 provided on the upper surface of the first P-terminal 14; and a sixth opposing face which is in proximity to and faces the fifth opposing face of the first N-terminal 13 in parallel. Although FIG. 3 exemplifies the rectangular parallelepiped second P-terminal 14, the second P-terminal 14 may be in a parallelepiped block-shape. The fourth mounting face, which is a side surface of the second P-terminal 14, preferably has the same surface level of a plane formed by the third connection face of the first N-terminal 13. The fourth mounting face of the second P-terminal 14 is connected to the second principal surfaces of the fourth semiconductor elements 23 by facing the fourth connection face of the second U-terminal 15 via the fourth circuit-board 43.

The second U-terminal 15, or the third main terminal 15, has: a fourth connection face which is a side surface facing in the opposite direction of the second connection face; and the third external-connection face 151 provided on the upper surface of the second U-terminal 15. Each end of the fourth terminal pins 33 is connected to the fourth connection face of the second U-terminal 15. The fourth circuit-board 43 is disposed along the fourth connection face of the second U-terminal 15 and holds each of the fourth terminal pins 33 perpendicularly to the fourth connection face. Each of the fourth semiconductor elements 23 has a vertical structure in which a main current flows from a first principal surface connected to each of the other ends of the fourth terminal pins 33, to an opposite second principal surface. The second U-terminal 15, or the third main terminal 15, has: a second mounting face which is a side surface to mount the second semiconductor elements 24; a third cooling face joined to the cooling substrate 5; and a third opposing face which is in proximity to and faces the second opposing face of the first U-terminal 12. Since FIG. 3 exemplifies the rectangular parallelepiped second U-terminal 15, the second mounting face and the third cooling face are orthogonal to each other. However, the second mounting face and the third cooling face do not necessarily have to be exactly orthogonal. For example, the second U-terminal 15 may be in a parallelepiped block-shape. The second mounting face preferably has the same surface level of a plane formed by the third connection face of the first U-terminal 12.

Each of the second semiconductor elements 24 has a main current path from a first principal surface joined to the second mounting face of the second U-terminal 15 to a second principal surface on an opposite side of the first principal surface. Each end of the second terminal pins 34 is connected to any one of the second principal surfaces of the second semiconductor elements 24. The second circuit-board 44 is disposed along the second mounting face of the second U-terminal 15 and holds each of the second terminal pins 34 perpendicularly to the second mounting face.

The second N-terminal 16, or the fourth main terminal 16, has: a second connection face facing the second mounting face of the second U-terminal 15; a fourth cooling face joined to the cooling substrate 5; the fourth external-connection face 161 provided on the upper surface of the second. N-terminal 16; and a fourth opposing face which is close to and faces the first opposing face of the first P-terminal 11 in parallel. Although FIG. 3 exemplifies the rectangular parallelepiped second N-terminal 16, the shape of the N-terminal 16 is not necessarily limited to the rectangular parallelepiped-shape, and may have some deformation in a parallelepiped block-shape or the like. The second connection face of the second N-terminal 16, or the fourth main terminal 16, preferably has the same surface level of a plane formed by the first mounting face of the first P-terminal 11. The second connection face of the second N-terminal 16, or the fourth main terminal 16, faces the second mounting face of the second U-terminal 15 via the second circuit board 44, and each of the other ends of the second terminal pins 34 are connected to the second connection face.

For example, each of the semiconductor elements 21, 22, 23, 24 may be arbitrarily selected from a switching element including a transistor, such as an insulated gate bipolar transistor (IGBT), a metal-oxide-semiconductor field effect transistor (MOSFET) and the like, and a thyristor, such as a static induction (SI) thyristor, a gate turn-off (GTO) thyristor and the like, or a diode, such as a Schottky barrier diode and the like. For example, in the IGBT or the like, the first main electrode denotes either electrode of an emitter electrode or a collector electrode, and the second main electrode denotes the other electrode. In the MOSFET or the like, the first main electrode denotes either electrode of a source or a drain, and the second main electrode denotes the other electrode. In the SI thyristor, the diode and the like, the first main electrode denotes either electrode of an anode electrode or a cathode electrode, and the second main electrode denotes the other electrode.

Each of the semiconductor elements 21, 22, 23, 24 is preferably a semiconductor chip having a vertical structure which has a first main electrode disposed on the first principal surface and a second main electrode formed on the opposing second principal surface. Each of the semiconductor elements 21, 22, 23, 24 has the vertical structure, whereby the main current path is provided between the first principal surface and the second principal surface of the semiconductor chip. That is, the first main electrodes of the semiconductor elements 21, 22, 23, 24 are electrically connected to the first P-terminal 11, the first U-terminal 12, the second P-terminal 14, and the second U-terminal 15, respectively. The second main electrodes of the semiconductor elements 21, 22, 23, 24 are electrically connected to the first terminal pins 31, the third terminal pins 32, the fourth terminal pins 33, and the second terminal pins 34, respectively. As a result, the second main electrodes of the semiconductor elements 21, 22, 23, 24 are electrically connected to the first U-terminal 12, the first N-terminal 13, the second U-terminal 15, and the second N-terminal 16, respectively.

The terminal pins 31, 32, 33, 34 are, specifically, classified into four terminal-pin groups including the first terminal pins 31, the second terminal pins 34, the third terminal pins 32 and the fourth terminal pins 33. Each of the terminal pins 31, 32, 33, 34 may be, for example, a column-shaped pin made of a material having high thermal conductivity and low electrical resistance, such as a metal material containing copper (Cu) and the like. The terminal pins 31, 32, 33, 34 are not limited to the column-shape, but may be in a polygonal-shape or in a block-shaped as long as each of the terminal pins 31, 32, 33, 34 has a cross-section smaller than the joining surfaces of the semiconductor elements 21, 22, 23, 24. The thermal resistance can be decreased by joining any one of the four terminal-pin groups, or by increasing the joining area of the one terminal pin, to the one semiconductor element.

Specifically, the circuit-boards 41, 42, 43, 44 are classified into four circuit-boards including the first circuit-board 41, the second circuit-board 44, a third circuit-board 42, a fourth circuit-board 43 and. Each of the circuit-boards 41, 42, 43, 44 is, for example, an implant printed-circuit-board into which the terminal pins 31, 32, 33, and 34 are preliminarily inserted. By using the implant printed-circuit-boards as the circuit-boards 41, 42, 43, 44 having the terminal pins 31, 32, 33, 34, the manufacturing processes can be simplified, and the manufacturing cost can be reduced. The terminal pins 31, 32, 33, 34 may not necessarily be held by the circuit-boards 41, 42, 43, 44, and may be disposed independently.

Figure 5:
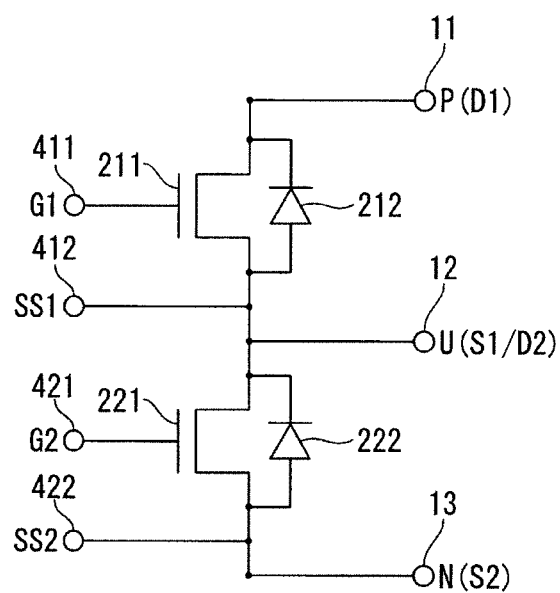
FIG. 5 is an equivalent-circuit diagram of a first circuit of the semiconductor device according to the first embodiment.

As illustrated in FIG. 5, the first semiconductor element 21, or a first semiconductor element (211, 212), are provided as an upper arm in a high-potential side to be connected between the first P-terminal 11 and the first U-terminal 12, and the third semiconductor element 22, or a third semiconductor element (221, 222), are provided as a lower arm in a low-potential side to be connected between the first U-terminal 12 and the first N-terminal 13. That is, the first P-terminal 11, the first U-terminal 12 and the first N-terminal 13 implement main terminals of a first half-bridge circuit illustrated in FIG. 5. Specifically, the first semiconductor elements 21 include a first semiconductor switching element 211 and a first diode 212 connected in antiparallel to each other between the first P-terminal 11 and the first U-terminal 12. In addition, the third semiconductor elements 22 include a third semiconductor switching element 221 and a third diode 222 connected in antiparallel to each other between the first U-terminal 12 and the first N-terminal 13.

For example, the semiconductor elements 21, 22, 23, 24 may be implemented by using an n-channel insulated gate field effect transistor (IGFET) as the semiconductor switching element, and a p-n diode as the diode.

In FIG. 5, one first semiconductor switching element 211, one first diode 212, one third semiconductor switching element 221, and one third diode 222 are illustrated, but FIG. 5 is merely a schematic illustration. In practice, for example, implementation including the plural first semiconductor devices 21, the plural second semiconductor devices 24, the plural third semiconductor devices 22, and the plural fourth semiconductor devices 23 may be used. For example, in each of the semiconductor elements 21, 22, 23, 24, a circuit configuration having four semiconductor switching elements connected in parallel to one another and two diodes connected in parallel to one another may be adopted.

The first P-terminal 11 is electrically connected to the drain of the first semiconductor switching element 211, and may be assigned as a high-potential-side terminal D1. The first U-terminal 12 is electrically connected to the drain of the third semiconductor switching element 221 and the source of the first semiconductor switching element 211, and may be assigned as a load-side terminal S1/D2. The first N-terminal 13 is electrically connected to the source of the third semiconductor switching element 221, and may be assigned as a low-potential-side terminal S2.

As illustrated in FIGS. 3, 4 and 5, the auxiliary terminal 411 attached on the first circuit-board 41 is electrically connected to a gate of the first semiconductor switching element 211 through a wiring pattern and a control-electrode pin 311 which are provided in the first circuit-board 41. Therefore, the auxiliary terminal 411 may be assigned as a control-electrode terminal G1. The auxiliary terminal 412 attached on the first circuit-board 41 is electrically connected to the source of the first semiconductor switching element 211 through a wiring pattern and the first terminal pins 31 which are provided in the first circuit-board 41. Therefore, the auxiliary terminal 412 may be assigned as a current-detection terminal SS1.

The auxiliary terminal 421 attached on the third circuit-board 42 is electrically connected to a gate of the third semiconductor switching element 221 through the wiring pattern and the control-electrode pin 321 which are provided in the third circuit-board 42, and is assigned as a control-electrode terminal G2. The auxiliary terminal 422 attached on the third circuit-board 42 is electrically connected to the source of the third semiconductor switching element 221 through the wiring pattern and the third terminal pins 32 which provided in the third circuit-board 42. Therefore, the auxiliary terminal 422 may be assigned as a current-detection terminal SS2.

As illustrated in FIG. 4, conductive element-joining materials 81, or first joining materials 81, conductively connect between the first P-terminal 11 and the first semiconductor elements 21, and between the first U-terminal 12 and the third semiconductor elements 22. The conductive pin-joining materials 821, 822, or first joining materials 821, 822, conductively connect between the first semiconductor elements 21 and the first terminal pins 31, between the first terminal pins 31 and the first U-terminal 12, between the third semiconductor elements 22 and the third terminal pins 32, and the third terminal pins 32 and the first N-terminal 13. Conductive terminal-joining materials 83, or second joining materials 83, conductively connect between the first P-terminal 11 and the terminal pattern 53 of the cooling substrate 5, between the first U-terminal 12 and the terminal pattern 53 of the cooling substrate 5, and the first N-terminals 13 and the terminal patterns 53 of the cooling substrate 5.

For the element-joining materials 81, the pin-joining materials 821, 822 and the terminal-joining materials 83, for example, a solder, a conductive adhesive having high thermal conductivity, and a sintered metal such as silver (Ag) nanoparticles may be arbitrarily adopted. Specifically, for the element-joining materials 81 and the terminal-joining materials 83, the sintered metal such as Ag nanoparticles may be adopted in order to give priority to the improvement of the thermal conductivity. For the pin-joining materials 821, 822, the solder may be adopted in order to give priority to absorption of displacement during joining and securing of joining strength in a small area.

The first half-bridge circuit is implemented by an assembly in which the first P-terminal 11, the first U-terminal 12, the first N-terminal 13, the first structure (21, 31, 41) and the second structure (22, 32, 42) are joined together. The first half-bridge circuit is mounted on the cooling substrate 5 after being assembled.

Similar to the first half-bridge circuit, the second P-terminal 14, the second U-terminal 15, and the second N-terminal 16 implement the main terminals of the second half-bridge circuit. The second half-bridge circuit has the third structure (23, 33, 43), in which the fourth semiconductor elements 23 are provided as the upper arm in the high-potential side, between the second P-terminal 14 and the second U-terminal 15. And the second half-bridge circuit has the fourth structure (24, 34, 44), in which the second semiconductor elements 24 are provided as the lower arm in the low-potential side, between the second U-terminal 15 and the second N-terminal 16. That is, the second half-bridge circuit having the same structure as the first half-bridge circuit, is disposed in parallel with the first half-bridge circuit in the reverse direction.

Figure 6:
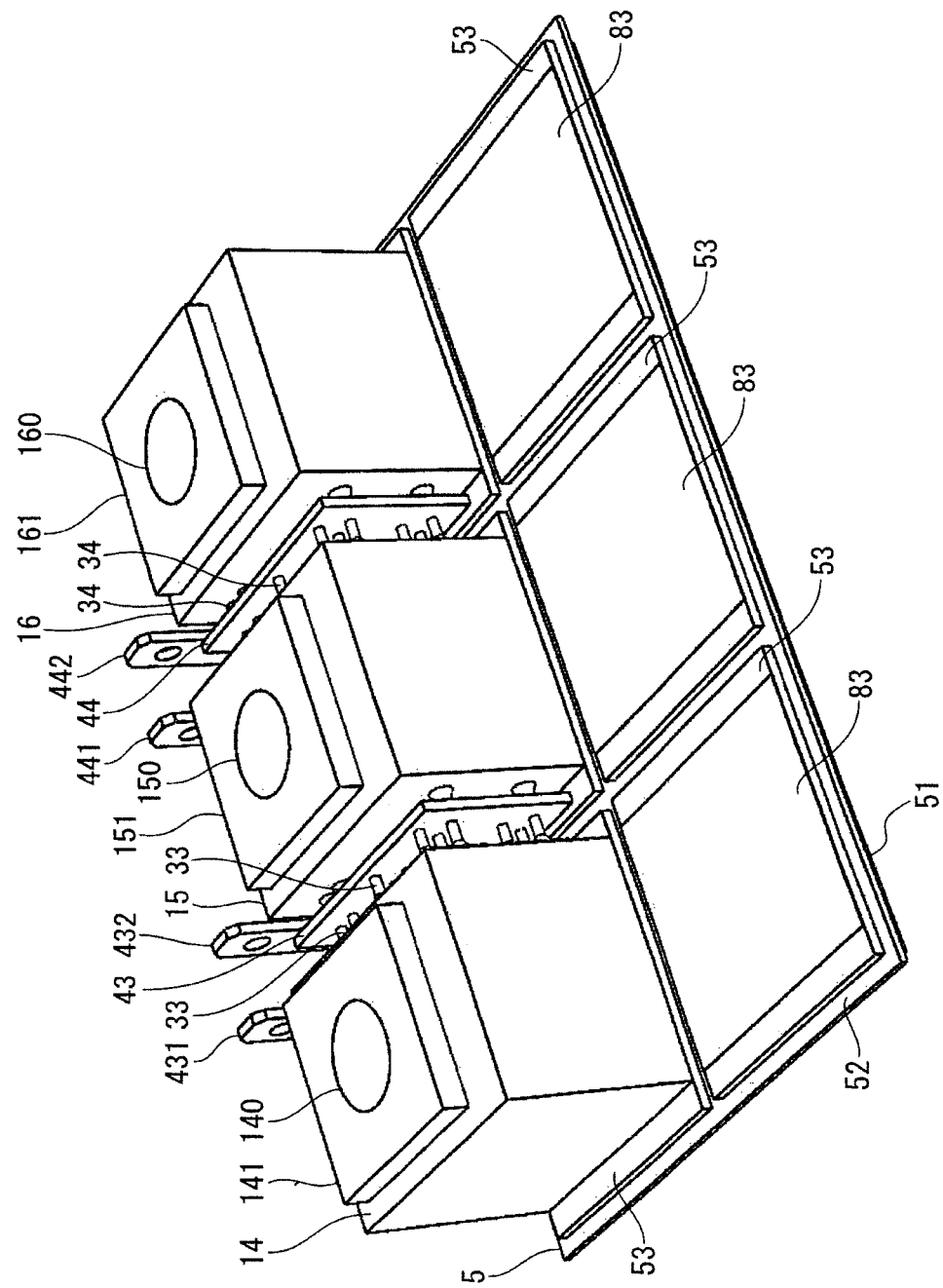
FIG. 6 is an example illustrating a state before mounting a first half-bridge circuit of the semiconductor device according to the first embodiment.

As illustrated in FIG. 6, each of the terminal patterns 53 is delineated in a region corresponding to the first P-terminal 11, the first U-terminal 12 and the first N-terminal 13 on the upper side of the cooling substrate 5. Furthermore, on each upper surface of the terminal patterns 53, each of the terminal-joining materials 83 is delineated in a region corresponding to the first P-terminal 11, the first U-terminal 12 and the first N-terminal 13. FIG. 6 illustrates the assembly of the second half-bridge circuit mounted on the terminal-joining materials 83 delineated on the cooling substrate 5. The assembly of the first half-bridge circuit and the assembly of the second half-bridge circuit are heated in a state of being mounted on the cooling substrate 5 provided through the terminal-joining materials 83, and the terminal-joining materials 83 are melted and solidified, or sintered. Thus, the first P-terminal 11, the first U-terminal 12, the first N-terminal 13, the second P-terminal 14, the second U-terminal 15 and the second N-terminal 16 are joined to the respective terminal patterns 53 of the cooling substrate 5.

Here, it is assumed that the melting points of the element-joining materials 81 and the pin-joining materials 821, 822 are lower than the melting point of the terminal-joining materials 83. In such case, during joining by the terminal-joining materials 83, there is a possibility that displacement between components or failure of joining may occur in joining portions by the element-joining materials 81 and the pin-joining materials 821, 822. Therefore, it is necessary to consider the melting point of the terminal-joining materials 83, that is, the second joining material, for joining between the cooling substrate 5 and each of the first P-terminal 11, the first U-terminal 12, and the first N-terminal 13. The melting point of the element-joining materials 81 and at least the pin-joining materials 821, that is, the first joining material, on the element side are selected to be higher than the melting point of the terminal-joining materials 83.

The first P-terminal 11, the first U-terminal 12 and the first N-terminal 13, and the second P-terminal 14, the second U-terminal 15 and the second N-terminal 16 are arranged in parallel to one another along a longitudinal direction of the case 6. The first P-terminal 11 in the high-potential side of the first half-bridge circuit is arranged side by side with the second N-terminal 16 in the low-potential side of the second half-bridge circuit in a width direction of the case 6, or a direction orthogonal to the main current flowing through each semiconductor element. The first N-terminal 13 in the low-potential side of the first half-bridge circuit is arranged side by side with the second P-terminal 14 in the high-potential side of the second half-bridge circuit in the width direction of the case 6. The first U-terminal 12 is arranged side by side with the second U-terminal 15 in the width direction of the case 6. As described above, the semiconductor device according to the first embodiment includes two half-bridge circuits arranged in the width direction of the case 6 so that the polarities of the terminals are alternated.

When the first half-bridge circuit and the second half-bridge circuit are connected in parallel with each other to the DC power supply, control signals are fed to the auxiliary terminals (411, 431, 421, 441), so that the first semiconductor elements 21 and the fourth semiconductor elements 23 which are as the upper arm, and the third semiconductor elements 22 and the second semiconductor elements 24 which are as the lower arm, alternately repeat on and off. The auxiliary terminals (411, 431, 421, 441) are conductively connected to the control electrodes of the first semiconductor elements 21, the fourth semiconductor elements 23, the third semiconductor elements 22 and the second semiconductor elements 24, respectively.

FIGS. 7A, 7B, 7C, 7D illustrate the current changes in the semiconductor device in which the first half-bridge circuit and the second half-bridge circuit are connected in parallel to the DC power supply, when the semiconductor elements of the upper arm and the semiconductor elements of the lower arm alternately turn on and off. Solid arrows indicate increasing current and dashed arrows indicate decreasing current. The on/off operation of the semiconductor elements is carried out in the order of FIG. 7A, FIG. 7B, FIG. 7C, and FIG. 7D, then returns to FIG. 7A, and thus, the cycle is repeated.

Figure 7A:
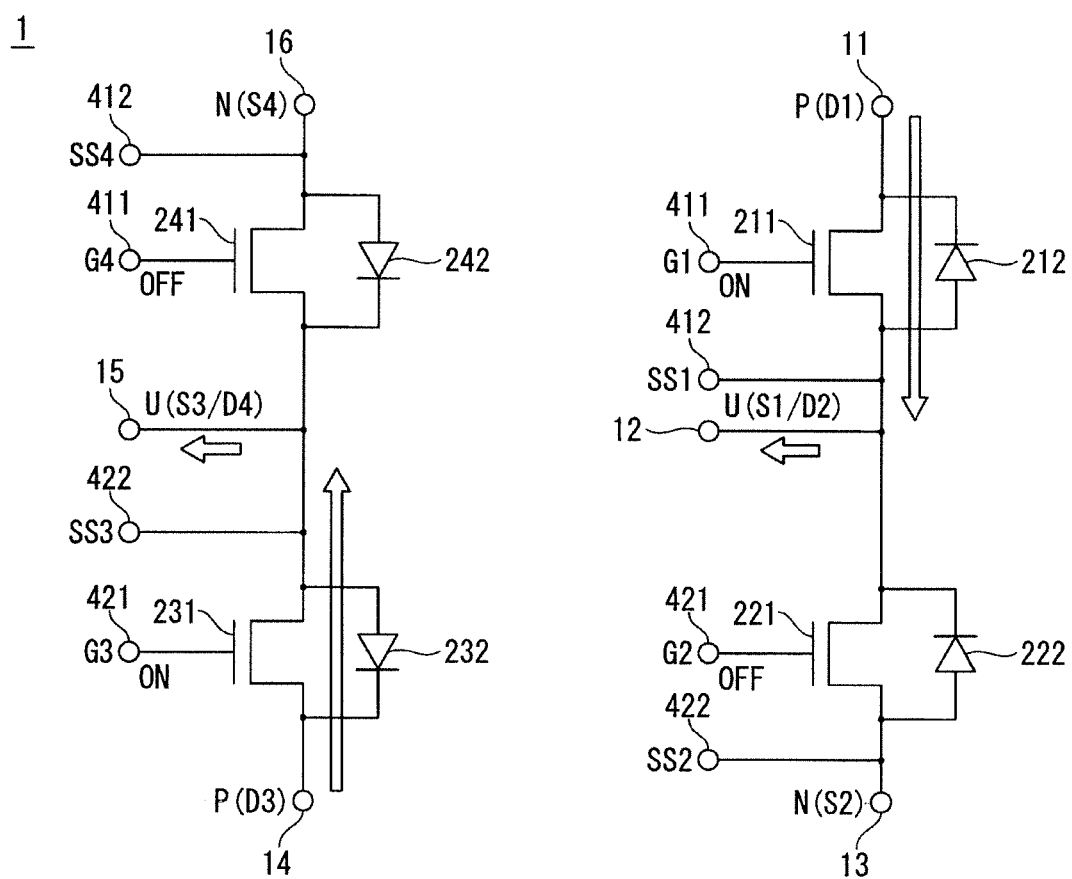
FIG. 7A is a circuit diagram (part 1) illustrating a temporal change of current flowing in the semiconductor device according to the first embodiment.

FIG. 7A illustrates a current change when the first semiconductor switching element 211 and the fourth semiconductor switching element 231 are turned on while the third semiconductor element 221 and the second semiconductor element 241 are turned off. As illustrated in FIG. 7A, current flowing from the first P-terminal (first main terminal) 11 to the mesa portion (second external connection face) 121 of the first U-terminal (second main terminal) 12 through the first semiconductor switching element 211 and the first terminal pin 31, is increased. And also, current flowing from the second P-terminal (sixth main terminal) 14 to the mesa portion (third external-connection face) 151 of the second U-terminal (third main terminal) 15 via the fourth semiconductor switching element 231 and the fourth terminal pin 33, is increased.

Figure 7B:
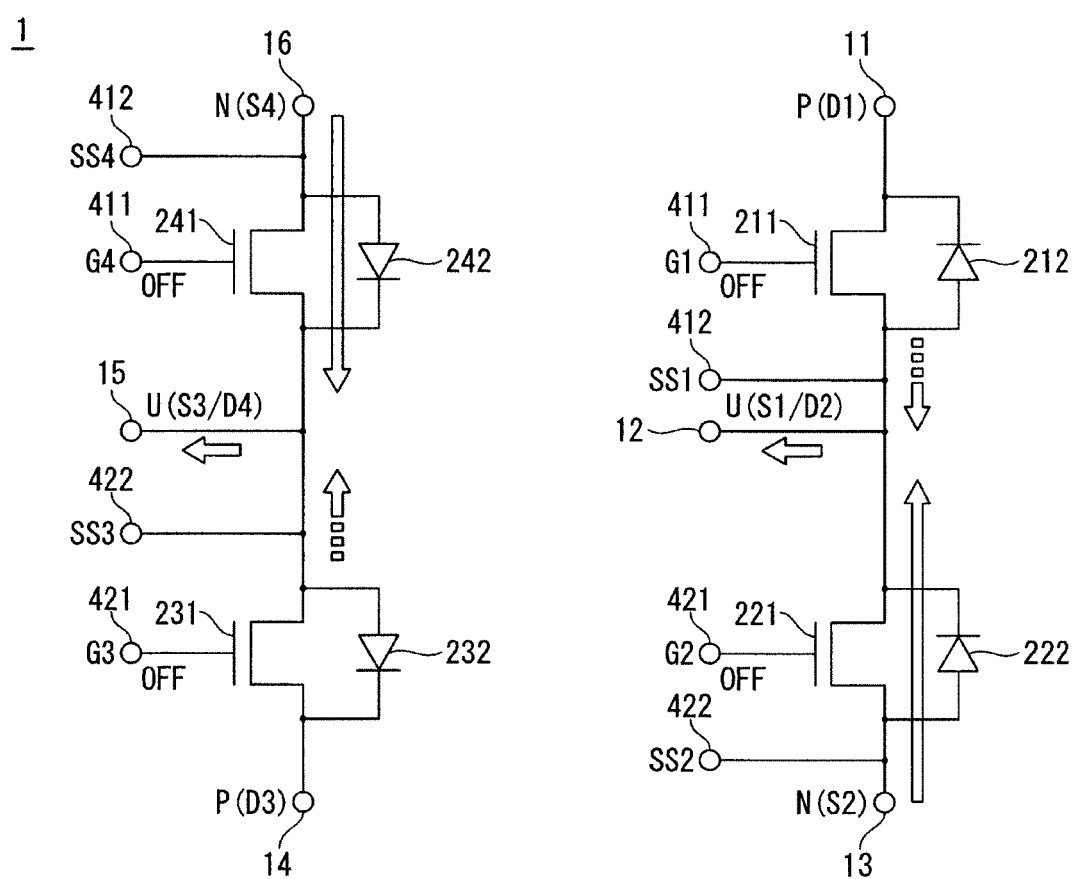
FIG. 7B is a circuit diagram (part 2) illustrating the temporal change of current flowing in the semiconductor device according to the first embodiment.

FIG. 7B illustrates a current change when the first semiconductor switching element 211 and the fourth semiconductor switching element 231 are turned off from the on state while the third semiconductor switching device 221 and the second semiconductor switching element 241 are turned off. As a flyback current to a coil of an external motor (not shown) connected to the first U-terminal (second main terminal) 12, current flowing from the first N-terminal (fifth main terminal) 13 to the mesa portion (second external-connection face) 121 of the first U-terminal (second main terminal) 12 through the third terminal pin 32 and the third diode 222, is increased. And, as a tail current of the first semiconductor switching element 211, current flowing from the first semiconductor switching element 211 to the mesa portion (second external-connection face) 121 of the first U-terminal (second main terminal) 12 through the terminal pin 31, is decreased. At the same time, as a flyback current to the coil of the external motor (not shown) connected to the second U-terminal (third main terminal) 15, current flowing from the second N-terminal (fourth main terminal) 16 to the mesa portion (third external connection surface) 151 of the second U-terminal (third main terminal) 15 through the second terminal pin 34 and the second diode 242, is increased. And, as a tail current of the fourth semiconductor switching element 231, current flowing from the fourth semiconductor switching element 231 to the mesa portion (third external connection surface) 151 of the second U-terminal (third main terminal) 15 through the fourth terminal pin 33, is decreased.

Therefore, the semiconductor device has a structure in which magnetic flux generated by the change in current between the second principal surface of the first semiconductor element 21 and the second external-connection face 121 of the second main terminal 12, and magnetic flux generated by the change in current between the first principal surface of the second semiconductor element 24 and the third external-connection face 151 of the third main terminal 15, cancel each other.

Figure 7C:
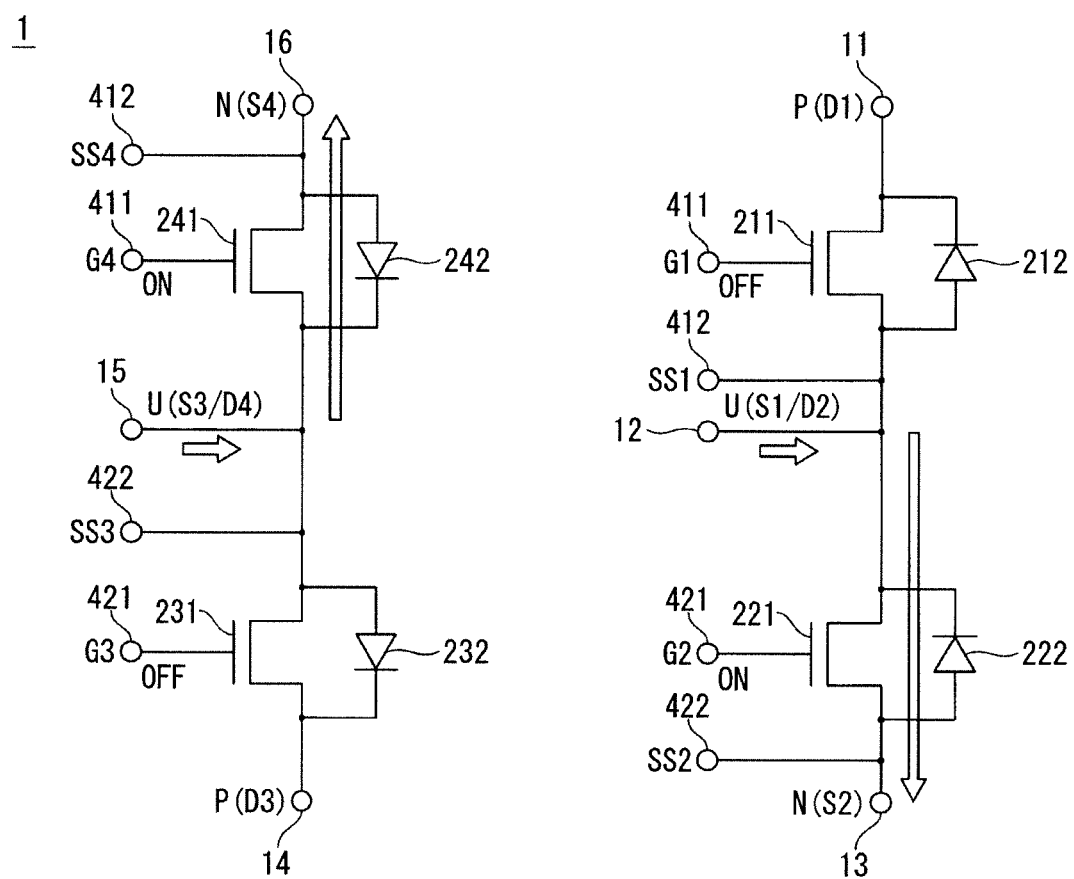
FIG. 7C is a circuit diagram (part 3) illustrating the temporal change of current flowing in the semiconductor device according to the first embodiment.

FIG. 7C illustrates a current change when the third semiconductor switching element 221 and the second semiconductor switching element 241 are turned on from the off state while the first semiconductor switching element 211 and the fourth semiconductor switching element 231 are turned off. As illustrated in FIG. 7C, current flowing from the first U-terminal (second main terminal) 12 to the first N-terminal (fifth main terminal) 13 through the third semiconductor switching element 221 and the third terminal pin 32, is increased. And, current flowing from the second U-terminal (third main terminal) 15 to the second N-terminal (fourth main terminal) 16 through the second semiconductor switching element 241 and the second terminal pin 34, is increased.

Figure 7D:
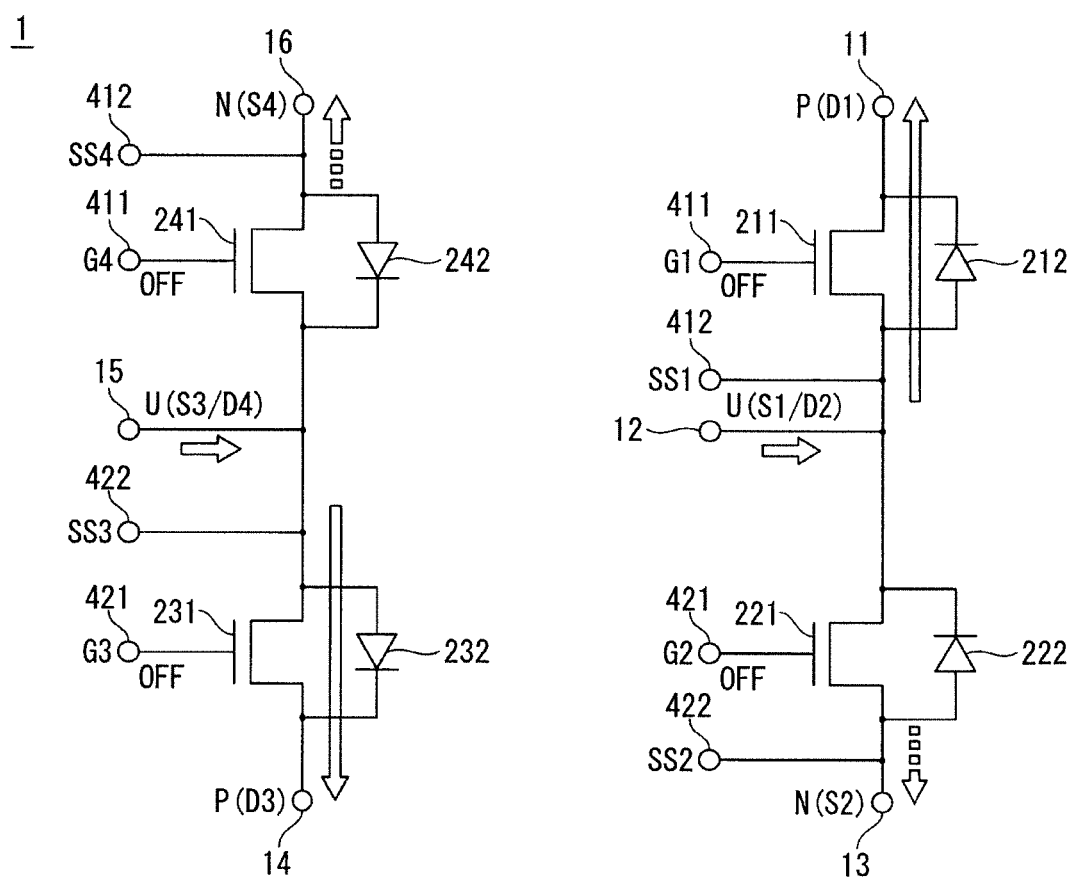
FIG. 7D is a circuit diagram (part 4) illustrating the temporal change of current flowing in the semiconductor device according to the first embodiment.

FIG. 7D illustrates a current change when the third semiconductor switching element 221 and the second semiconductor switching device 241 are turned off from the on state while the first semiconductor switching element 211 and the fourth semiconductor switching element 231 turned off. As a flyback current from the coil of the external motor (not shown) connected to the first U-terminal (second main terminal) 12, current flowing from the first U-terminal (second main terminal) 12 to the first P-terminal (first main terminal) 11 through the first terminal pin 31 and the first diode 212, is increased. And, as a tail current of the third semiconductor switching element 221, current flowing from the third semiconductor switching element 221 to the first N-terminal (fifth main terminal) 13 through the third terminal pin 32, is decreased. At the same time, as a flyback current from the coil of the external motor (not shown) connected to the second U-terminal (third main terminal) 15, current flowing from the second U-terminal (third main terminal) 15 to to the second P-terminal (sixth main terminal) 14 through the fourth terminal pin 33 and the fourth diode 232, is increased. And, as a tail current of the second semiconductor switching element 241, current flowing from the second semiconductor switching element 241 to the second N-terminal (fourth main terminal) 16 through the second terminal pin 34, is decreased.

Therefore, the semiconductor device has a structure in which magnetic flux generated by the current change between the second principal surface of the first semiconductor element 21 and the second external-connection face 121 of the second main terminal 12, and magnetic flux generated by the change in current between the first principal surface of the second semiconductor element 24 and the third external-connection face 151 of the third main terminal 15, cancel each other.

As described above, in the semiconductor device according to the first embodiment, the first P-terminal 11, the first U-terminal 12, and the first N-terminal 13 in the first half-bridge circuit, and the second N-terminal 16, the second U-terminal 15, and the second P-terminal 14 in the second half-bridge circuit are disposed adjacent to and in parallel with each other while being separated from each other. Then, the semiconductor switching elements in each half-bridge circuit are arranged so that the currents flowing through the first half-bridge circuit and the second half-bridge circuit are substantially parallel and have change rates of the currents in opposite polarities, when the semiconductor switching elements in each half-bridge circuit are turned off from the on state. Therefore, in the semiconductor device according to the first embodiment, the magnetic fluxes generated due to the changes in the flowing currents are canceled each other. As a result, inductances of the first half-bridge circuit and the second half-bridge circuit can be reduced.

The first P-terminal 11, the first U-terminal 12 and the first N-terminal 13, and the second N-terminal 16, the second U-terminal 15 and the second P-terminal 14 are effective to be as close as possible to each other. However, the closer the terminals are to one another, the more the insulation becomes problematic. In the semiconductor device according to the first embodiment, the case 6 is provided as a sealing resin to seal the assemblies implementing the first half-bridge circuit and the second half-bridge circuit in a state of being mounted on the cooling substrate 5 so as to expose at least the upper surface of each main terminal and the lower surface of the cooling substrate 5. Therefore, in the semiconductor device according to the first embodiment, since the spaces among the main terminals 11, 12, 13, 14, 15, 16 are filled with the resin material, it is possible to improve the insulating property and the mechanical strength.

As described in N. Nashida et al. "All-SiC Module Technology" (Fuji Electric Technical Journal, November 2012, Vol. 85, No. 6, p. 403-407), the inductance of a semiconductor device having a structure as described in WO 2014/061211 is about 12 nH in a low frequency region. On the other hand, in the semiconductor device according to the first embodiment, the block-shaped main terminals 11, 12, 13, 14, 15, 16 are used to unify the terminals and the wiring, and the semiconductor elements are sandwiched and stacked. Thus, the wiring distance can be extremely shortened, and the self-inductance can be reduced. Furthermore, by arranging the terminals 11, 12, 13, 14, 15, 16 in antiparallel, further reduction in inductance may be achieved.

Here, self-inductance of the stand-alone first half-bridge circuit implemented by the first P-terminal 11, the first structure (21, 31, 41), the first U-terminal 12, the second structure (22, 32, 42) and the first N-terminal 13 has been calculated about 11 nH by simulation. Furthermore, in the first half-bridge circuit and the second half-bridge circuit in which polarities of the main terminals are alternately arranged, the inductance has been reduced to about 3 nH by the simulation even in the low frequency region.

Even if two semiconductor devices described in WO 2014/061211 are connected in parallel and can be used without interference with each other, there is also influence of wiring connecting the two semiconductor devices to each other. Thus, the inductance is estimated to be half of the stand-alone semiconductor device, that is, about 6 nH or more. Therefore, according to the semiconductor device according to the first embodiment, it is understood that the inductance can be significantly reduced as compared with the conventional configuration.

In a general power semiconductor module, an insulating substrate for cooling is disposed on one side of the semiconductor element in order to secure the cooling capability, but in this case, the wiring distance is increased due to the wire, the printed circuit-board, and the like. On the other hand, in the semiconductor device according to the first embodiment, the semiconductor elements 21, 22, 23, 24 are disposed on the side surfaces of the block-shaped main terminals joined to the cooling substrate 5, respectively.

More specifically, in the semiconductor device according to the first embodiment, since the semiconductor elements 21, 22, 23, 24 are merely disposed and stacked on the side surfaces of the main terminals, the wiring distance becomes extremely short so as to reduce the size and inductance of the semiconductor device. On the contrary, since the chip surfaces of the semiconductor elements 21, 22, 23, 24 are perpendicular to the cooling substrate 5, the distance from each semiconductor element to the cooling face of the main terminal in contact with the cooling substrate 5 is increased. However, since the block-shaped main terminal having high thermal conductivity is adopted in the semiconductor device according to the first embodiment, it is possible to prevent a decrease in cooling capability.

Furthermore, the semiconductor device according to the first embodiment may further improve the cooling capability by adopting a metal-baseless structure using the cooling substrate 5 having the insulating substrate 52 and reducing the loss due to the reduction of the inductance. Further, in the semiconductor device according to the first embodiment, since one cooling substrate 5 is joined to the two half-bridge circuits, the lower surface of the cooling substrate 5 may be used as a wide cooling face, and the cooling capability can be further improved. As a result, the cooling capability may be equal to or greater than that of a general structure in which semiconductor elements are mounted in parallel with the cooling substrate 5.

Further, since the semiconductor device according to the first embodiment uses block-shaped main terminals 11, 12, 13, 14, 15, 16 having the screw holes 110, 120, 130, 140, 150, 160, respectively. And the connection with the bus-bar may be easy.

In particular, in the semiconductor device according to the first embodiment, the first P-terminal 11 and the second N-terminal 16 are disposed adjacent to each other, and the first N-terminal 13 and the second P-terminal 14 are disposed adjacent to each other. With such arrangement relationship, when the user connects the bus-bars in the device, it is possible to easily laminate a P-wiring and an N-wiring from the vicinity of the terminals via an insulating sheet, and also to suppress the inductance due to the wiring.

Further, in the semiconductor device according to the first embodiment, it is possible to provide a plurality of terminal pins to connect each of the semiconductor elements and the main terminal. By providing the terminal pins for each semiconductor element, the heat generated by each semiconductor element can be transferred to the opposite main terminal while securing the insulation between the main terminals. In addition, the displacement during joining the semiconductor element and the main terminal with the terminal pins may be prevented by using a high precision jig and a self-alignment technique in which the chip automatically moves to the optimum position when joining with a solder and the like.

As described above, the semiconductor device according to the first embodiment has a small size, low inductance, and high cooling capability. Therefore, in the semiconductor device according to the first embodiment, it is possible to achieve higher speed switching, and to improve energy efficiency of a power electronic device.

Second Embodiment

FIGS. 8A, 8B, 8C, and 8D illustrate current changes in a semiconductor device of a single-phase inverter in which the first half-bridge circuit and the second half-bridge circuit are connected in parallel to the DC power supply, and a coil 100 of an external motor is connected between the first U-terminal (second main terminal) 12 and the second U-terminal (third main terminal) 15, when the semiconductor elements of the upper arm and the semiconductor elements of the lower arm alternately turn on and off. The solid arrows indicate increasing current and dashed arrows indicate decreasing current. The on/off operation of the semiconductor elements is carried out in the order of FIG. 8A, FIG. 8B, FIG. 8C, and FIG. 8D, then returns to FIG. 8A, and thus, the cycle is repeated.

Figure 8A:
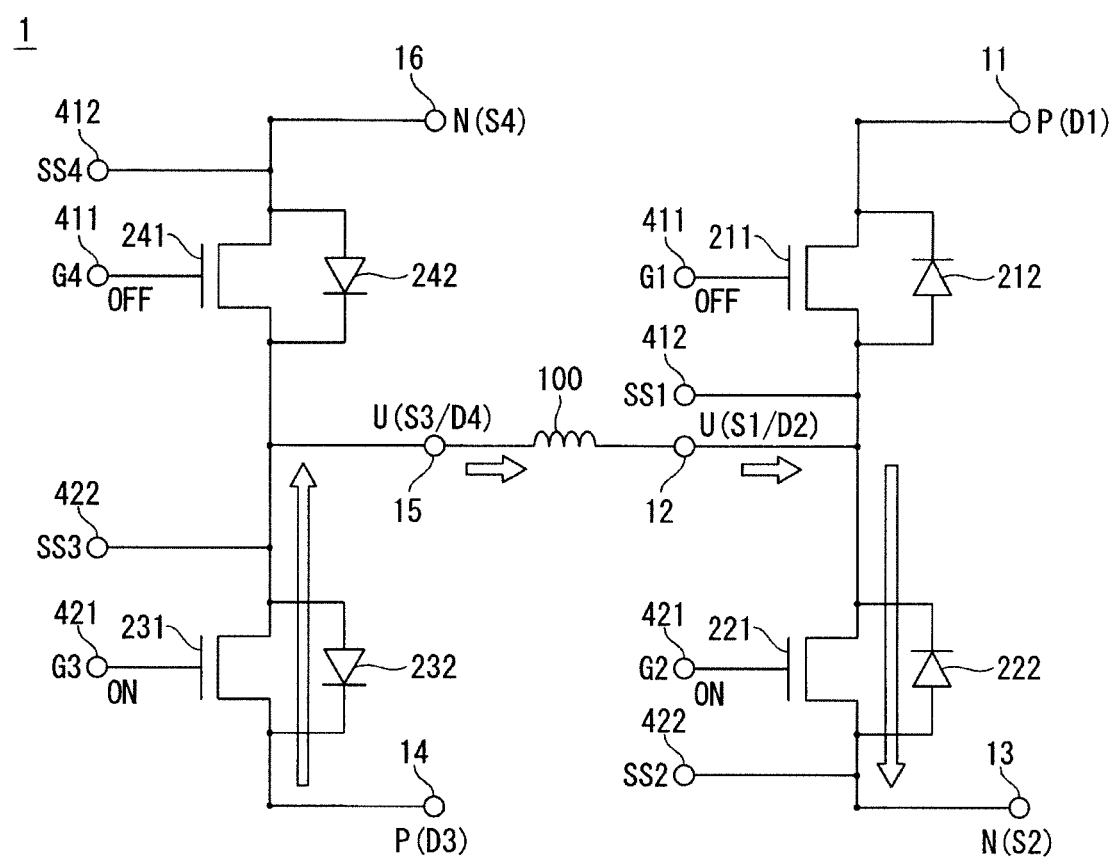
FIG. 8A is a circuit diagram (part 1) illustrating a temporal change of current flowing in a semiconductor device according to a second embodiment.

FIG. 8A illustrates a current change when the third semiconductor switching element 221 and the fourth semiconductor switching element 231 are turned on while the first semiconductor device 211 and the second semiconductor device 241 are turned off. As illustrated in FIG. 8A, current flowing from the second P-terminal (sixth main terminal) 14 to the first N-terminal (fifth main terminal) 13 through the fourth semiconductor switching element 231, the fourth terminal pin 33, the mesa portion (third external-connection face) 151 of the second U-terminal (third main terminal) 15, the coil 100 of the external motor, the mesa portion (second external-connection face) 121 of the first U-terminal (second main terminal) 12, the third semiconductor switching element 221, and the third terminal pin 32, is increased. The currents flowing in the forward directions of the third semiconductor switching device 221 and the fourth semiconductor switching device 231 are in opposite directions to each other.

Figure 8B:
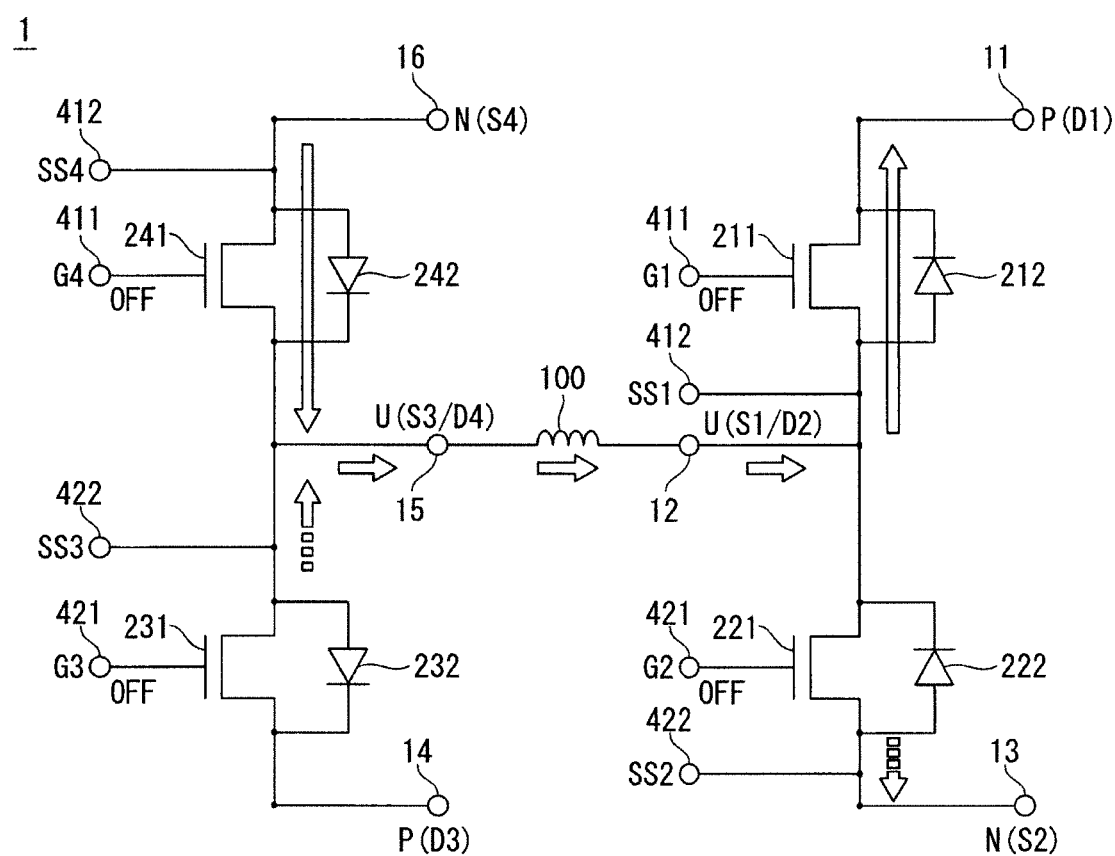
FIG. 8B is a circuit diagram (part 2) illustrating the temporal change of current flowing in the semiconductor device according to the second embodiment.

FIG. 8B illustrates a current change when the third semiconductor switching element 221 and the fourth semiconductor switching element 231 are turned off from the on state while the first semiconductor switching element 211 and the second semiconductor switching element 241 are turned off. When the third semiconductor switching element 221 and the fourth semiconductor switching element 231 are turned off from the on state, a counter electromotive force is generated in the coil 100 of the external motor connected between the second U-terminal (third main terminal) 15 and the first U-terminal (second main terminal) 12. Thus, as a flyback current, current flowing from the second N-terminal (fourth main terminal) 16 to the first P terminal (first main terminal) 11 through the second terminal pin 34, the second diode 242, the mesa portion (third external-connection face)

151 of the second U-terminal (third main terminal) 15, the coil 100 of the external motor, the mesa portion (second external-connection face) 121 of the first U-terminal (second main terminal) 12, the first terminal pin 31, and the first diode 212, is increased. At the same time, as a tail current of the fourth semiconductor switching element 231, current flowing from the fourth semiconductor switching element 231 to the mesa portion (third external connection surface) 151 of the second U-terminal (third main terminal) 15 through the fourth terminal pin 33, is decreased, and as a tail current of the third semiconductor switching element 221, current flowing from the third semiconductor switching element 221 to the mesa portion (fifth external-connection face) 131 of the first N-terminal (fifth main terminal) 13 through the third terminal pin 32, is decreased. The current flowing decreases. The currents flowing in the forward directions of the first diode 212 and the second diode 242 are in opposite directions to each other.

Figure 8C:
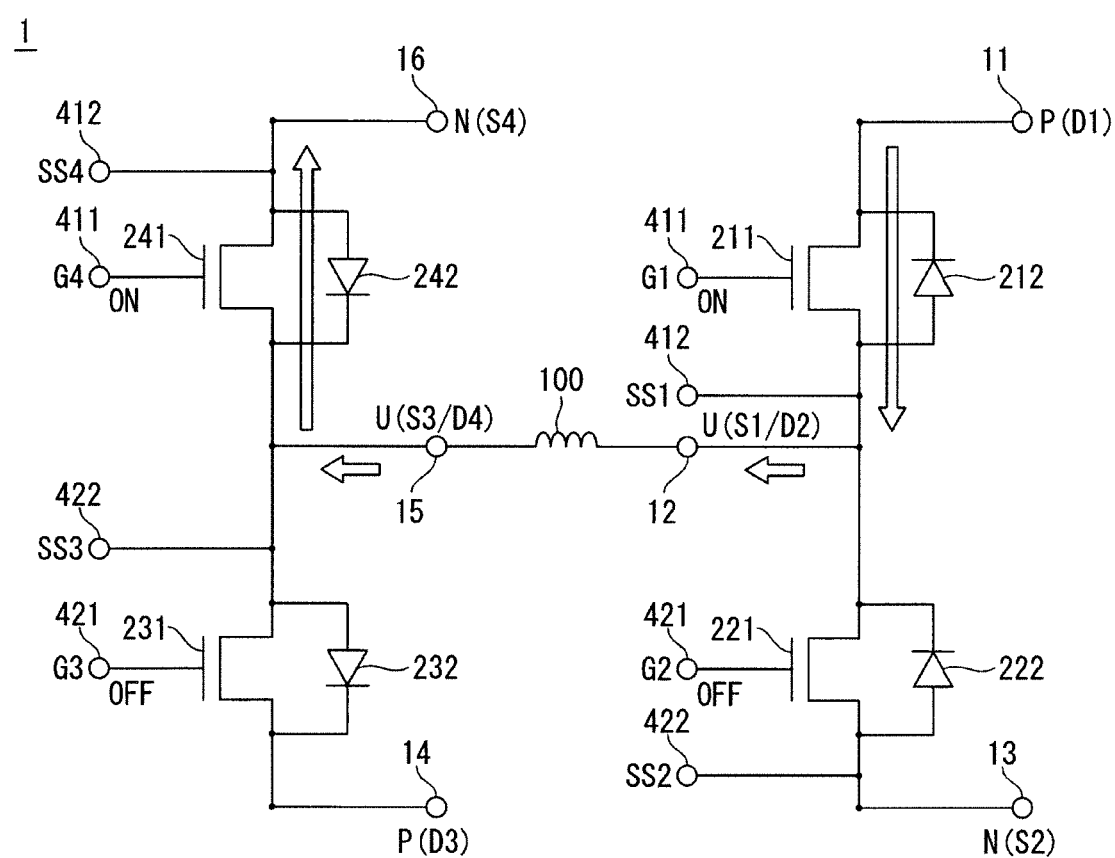
FIG. 8C is a circuit diagram (part 3) illustrating the temporal change of current flowing in the semiconductor device according to the second embodiment.

FIG. 8C illustrates a current change when the first semiconductor element 211 and the second semiconductor element 241 are turned on while the third semiconductor switching element 221 and the fourth semiconductor switching element 231 are turned off. As illustrated in FIG. 8C, current flowing from the first P-terminal (first main terminal) 11 to the second N-terminal (fourth main terminal) 16 through the first semiconductor switching element 211, first terminal pin 31, the mesa portion (second external-connection face) 121 of the first U-terminal (second main terminal) 12, the coil 100 of the external motor, the mesa portion (third external-connection face) 151 of the second U-terminal (third main terminal) 15, the second semiconductor switching element 241, and the second terminal pin 34, is increased. The currents flowing in the forward directions of the first semiconductor switching element 211 and the second semiconductor switching element 241 are in opposite directions to each other.

Figure 8D:
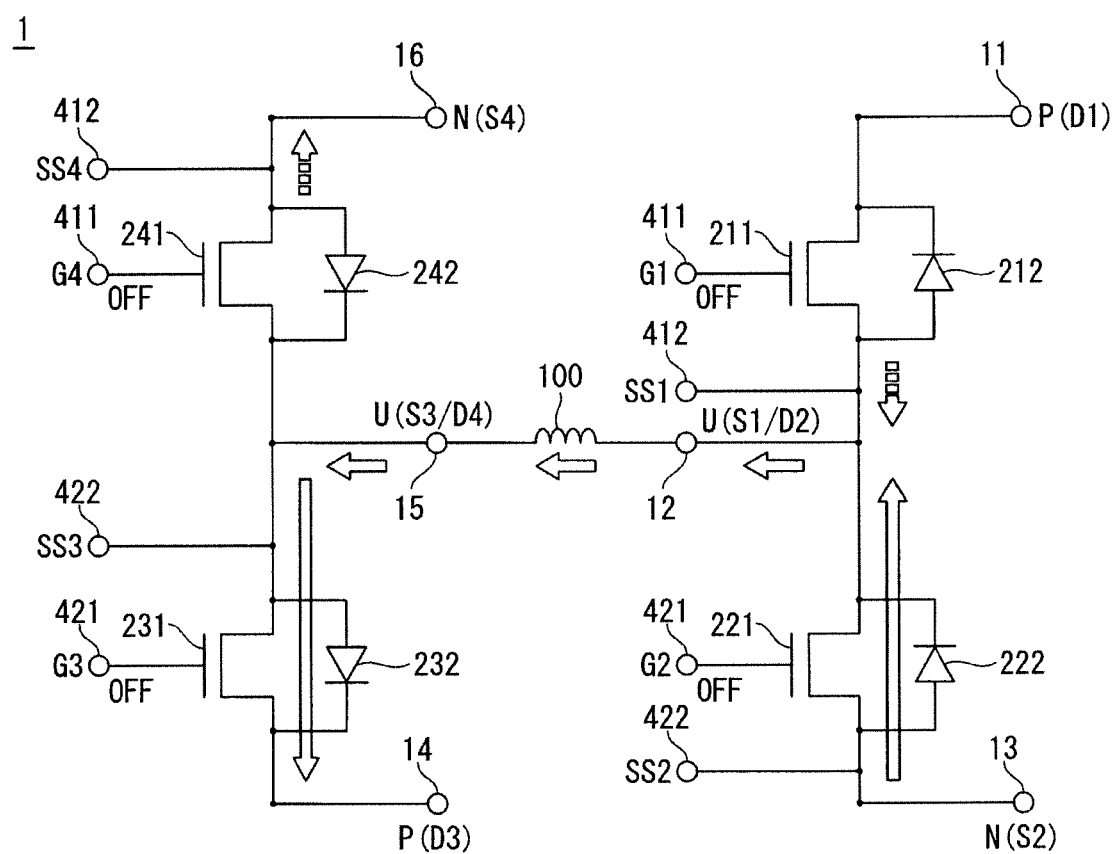
FIG. 8D is a circuit diagram (part 4) illustrating the temporal change of current flowing in the semiconductor device according to the second embodiment.

FIG. 8D illustrates a current change when the first semiconductor switching device 211 and the second semiconductor switching device 241 are ted off from the on state while the third semiconductor switching device 221 and the fourth semiconductor switching device 231 are turned off. When the first semiconductor switching device 211 and the second semiconductor switching device 241 are turned off from the on state, a counter electromotive force is generated in the coil 100 of the external motor connected between the first U-terminal (fifth main terminal) 12 and the second U-terminal (third main terminal) 12. Thus, as a flyback current, current flowing from the first N-terminal (fifth main terminal) 13 to the second P-terminal (sixth main terminal) 14 through the third terminal pin 32, the third diode 222, the mesa portion (second external-connection face) 121 of the first U-terminal (second main terminal) 12, the coil 100 of the external motor, the mesa portion (third external-connection face) 151 of second U-terminal (third main terminal) 15, the fourth terminal pin 33, and the fourth diode 232, is increased. At the same time, as a tail current of the first semiconductor switching element 211, current flowing from the first semiconductor switching element 211 to the mesa portion (fourth external-connection face) 161 of the second N-terminal (fourth main terminal) 16 through the first terminal pin 31, is decreased, and as a tail current of the second semiconductor switching element 241, current flowing from the second semiconductor switching element 241 to the mesa portion (fourth external-connection face) 161 of the second N-terminal (fourth main terminal) 16 through the second terminal pin 34, is decreased. The currents flowing in the forward directions of the third diode 222 and the fourth diode 232 are in opposite directions to each other.

Third Embodiment

Figure 9:
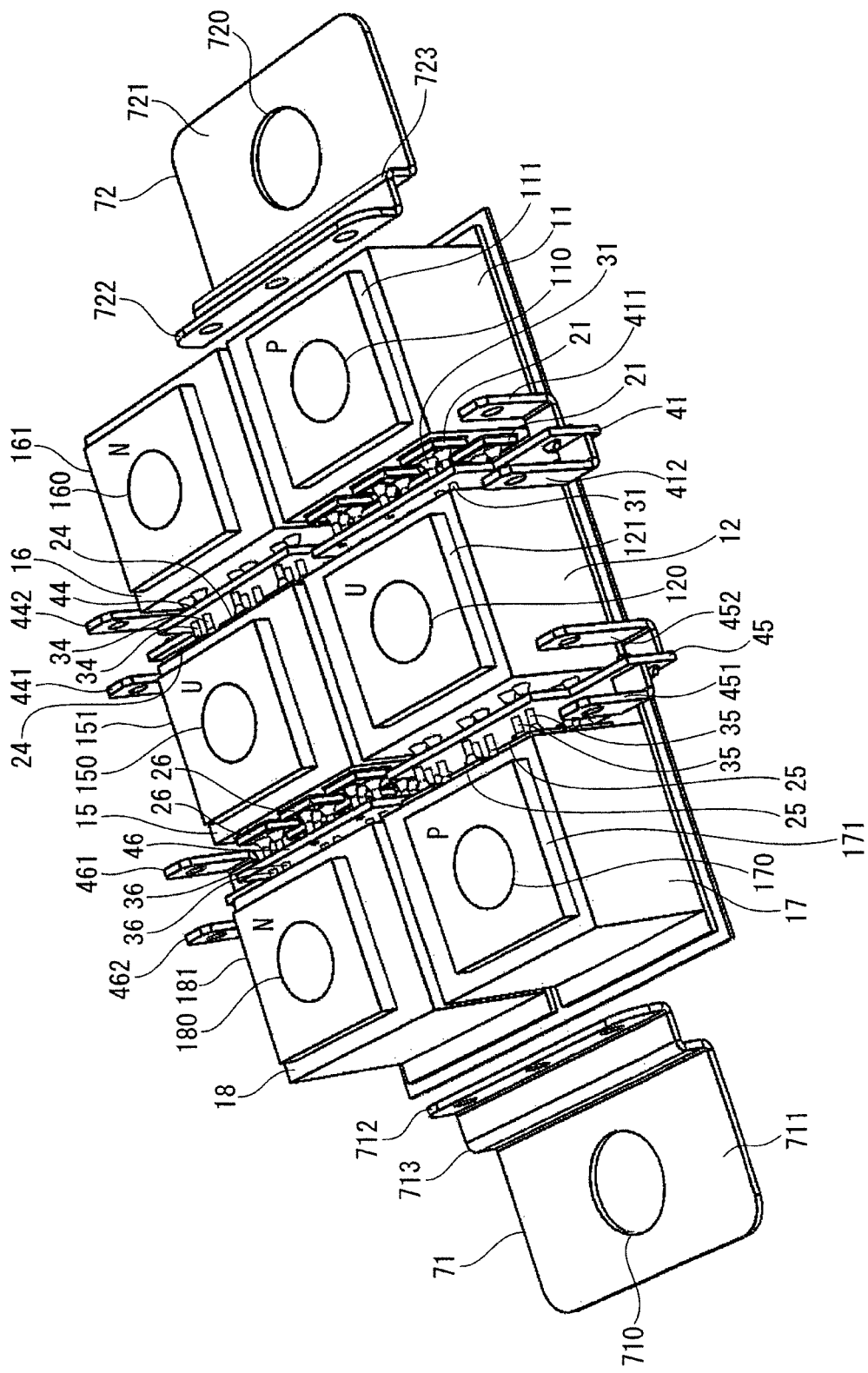
FIG. 9 is a perspective view illustrating an internal configuration of a semiconductor device according to a third embodiment.
Figure 10:
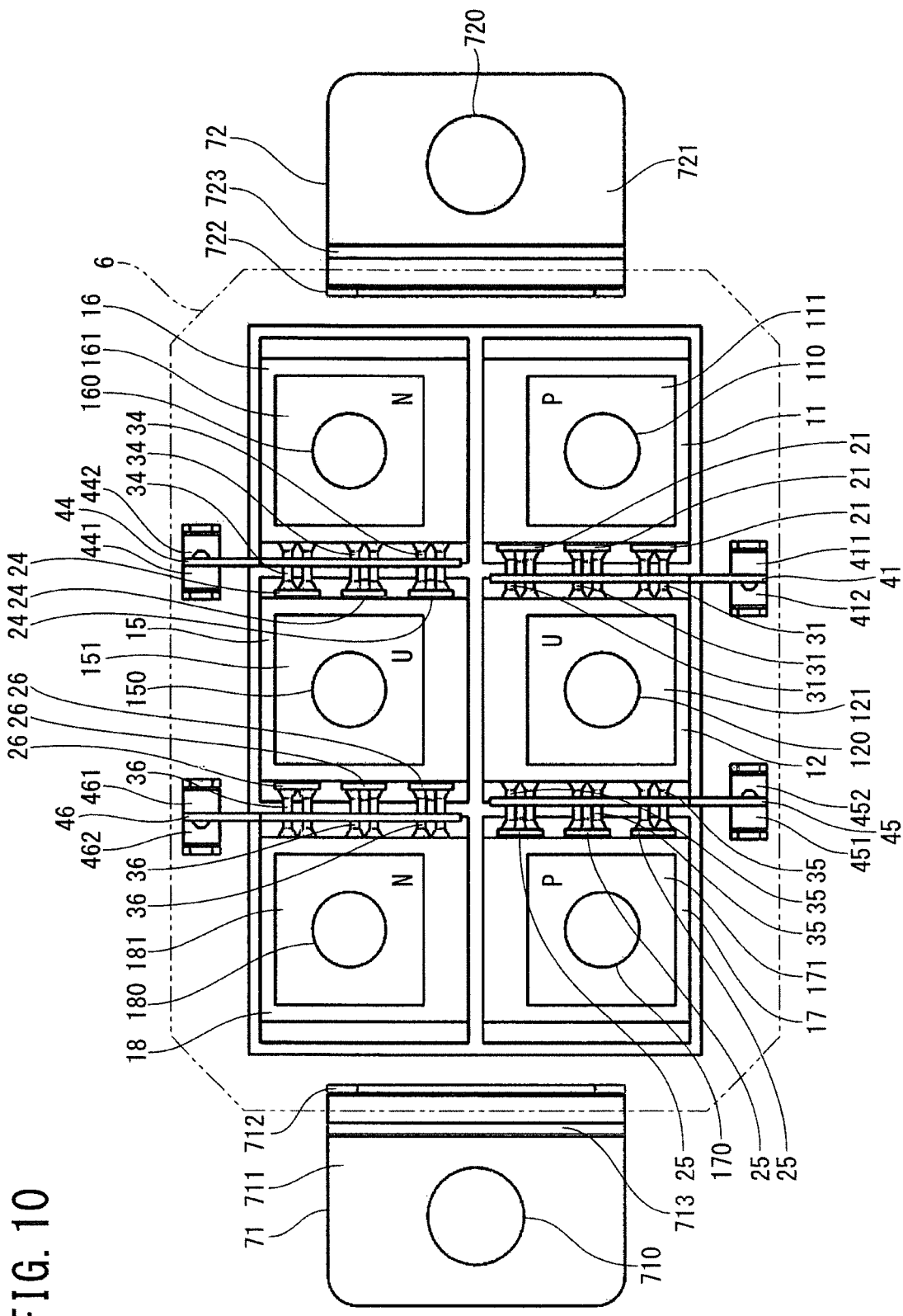
FIG. 10 is a top view illustrating the internal configuration of the semiconductor device according to the third embodiment.

The semiconductor device according to the first embodiment has the main terminal arrangement of P-U-N; N-U-P as illustrated in FIG. 3. However, a semiconductor device according to a third embodiment of the present invention differs from the semiconductor device according to the first embodiment in that the semiconductor device according to the third embodiment has a main terminal arrangement of P-U-P; N-U-N, as illustrated in FIGS. 9 and 10. More specifically, instead of the first N-terminal (fifth main terminal) 13 arranged on the left side of FIG. 3, a third P-terminal (seventh main terminal) 17 is used, and instead of the second. P-terminal (sixth main terminal) 14, a third N-terminal (eighth main terminal) 18 is used. Therefore, instead of the second structure (22, 32, 42) of FIG. 3, a fifth structure (25, 35, 45) is provided, as illustrated in FIGS. 9 and 10. Further, instead of the third structure (23, 33, 43) of FIG. 3, a sixth structure (26, 36, 46) is provided, as illustrated in FIGS. 9 and 10. The configurations, operations, and effects not described in the third embodiment are substantially the same as those in the first embodiment, and thus redundant description will be omitted.

The third P-terminal 17 and the third N-terminal 18 each have a rectangular parallelepiped block-shape. The third P-terminal 17 has a mesa portion 171 which is formed to be a higher level in height than the other portion so that an upper surface of the mesa portion 171 is exposed from the upper surface of the case 6 while being held inside the case 6 (see FIG. 1). Furthermore, the third P-terminal 17 is formed on the upper surface of the mesa portion 171, and has a screw hole 170 which is a structure for connection with another conductor, such as a bus-bar and the like. The third N-terminal 18 has a mesa portion 181 formed to be higher level in height than the other portions, and a screw hole 180 which is formed on the upper surface of the mesa portion 181 and is a structure for connection to another conductor.

The fifth structure (25, 35, 45) has a plurality of fifth semiconductor elements 25, a plurality of fifth terminal pins 35, and a fifth circuit-board 45. The sixth structure (26, 36, 46) has a plurality of sixth semiconductor elements 26, a plurality of sixth terminal pins 36, and a sixth circuit-board 46. The fifth structure (25, 35, 45) corresponds to the first structure (21, 31, 41) obtained by inverting the arrangement of the protrusion of the first circuit-board 41, the auxiliary terminal (control terminal G1) 411, and the auxiliary terminal (SS1) 412 in the left-right direction in FIG. 3 and inverting the first structure (21, 31, 41) in the left-right direction in FIG. 3. The sixth structure (26, 36, 46) corresponds to the fourth structure (24, 34, 44) obtained by inverting the arrangement of the protrusion of the second circuit-board 44, the auxiliary terminal (control terminal G4) 441, and the auxiliary terminal (SS4) 442 in the left-right direction in FIG. 3 and inverting the fourth structure (24, 34, 44) in the left-right direction in FIG. 3. More specifically, the semiconductor device according to the third embodiment has mirror symmetry with respect to a plane passing through the center of gravity of the structure illustrated in FIG. 10 and orthogonal to the longitudinal direction of the case 6.

The fifth semiconductor elements 25 and the sixth semiconductor elements 26 each have four semiconductor switching elements connected in parallel to one another and two diodes connected in parallel to one another. In each of the fifth semiconductor elements 25 and the sixth semiconductor elements 26, the semiconductor switching elements and the diodes are connected in antiparallel to each other. The semiconductor device according to the third embodiment includes auxiliary terminals 451, 452 attached to the fifth circuit-board 45 and auxiliary terminals 461, 462 attached to the sixth circuit-board 46.

The auxiliary terminal 451 is electrically connected to a gate of a fifth switching element 251 of the fifth semiconductor element 25 through a wiring pattern of the fifth circuit-board 45 and a control-electrode pin, and serves as a control-electrode terminal. The auxiliary terminal 452 is electrically connected to a source of the fifth switching element 251 of the fifth semiconductor element 25 through a wiring pattern of the fifth circuit-board 45 and the fifth terminal pins 35, and serves as a current-detection terminal. Similarly, the auxiliary terminal 461 is electrically connected to a gate of a sixth semiconductor switching element 261 of the sixth semiconductor element 26 through a wiring pattern of the sixth circuit-board 46 and a control-electrode pin, and serves as a control-electrode terminal. The auxiliary terminal 462 is electrically connected to a source of the sixth semiconductor switching element 261 of the sixth semiconductor element 26 through a wiring pattern of the sixth circuit-board 46 and the sixth terminal pins 36, and serves as a current-detection terminal.

In the semiconductor device according to the third embodiment, a surface facing in the opposite direction of the first connection face to which the first terminal pins 31 of the first U-terminal 12 are joined is defined as a fifth connection face. Each of the fifth terminal pins 35 has one end connected to the fifth connection face of the first U-terminal 12. The fifth semiconductor elements 25 are semiconductor chips each having a vertical structure in which a main current flows from a tenth principal surface connected to the other ends of the fifth terminal pins 35 to an opposite ninth principal surface. The third P-terminal (the seventh main terminal) 17 has a fifth mounting face which faces the fifth connection face of the first U-terminal 12 through the fifth circuit-board 45, and is connected to the ninth principal surfaces of the fifth semiconductor elements 25. The third P-terminal 17 further has a seventh cooling face joined to the cooling substrate 5 and a seventh opposing face facing the third N-terminal (eighth main terminal) 18.

Similarly, in the semiconductor device according to the third embodiment, a surface facing in the opposite direction of the second mounting face of the second U-terminal 15 is defined as a sixth mounting face. The eleventh principal surfaces of the sixth semiconductor elements 26 are joined to the sixth mounting face of the second U-terminal 15. The sixth semiconductor elements 26 are semiconductor chips each having a vertical structure in which a main current flows from an eleventh principal surface to an opposite twelfth principal surface. Each of the sixth terminal pins 36 has one end connected to the twelfth principal surface of the sixth semiconductor element 26. The third N-terminal (eighth main terminal) 18 has a sixth connection face which has the same plane level of the plane formed by the fifth mounting face of the third P-terminal 17, and faces the sixth mounting face of the second U-terminal 15 through the sixth circuit-board 46. And the sixth connection face is connected to the other end of the sixth terminal pins 36. Furthermore, the first N-terminal 18 has an eighth cooling face joined to the cooling substrate 5 and an eighth opposing face close to and parallel to the seventh opposing face of the second P-terminal 17.

Figure 10A:
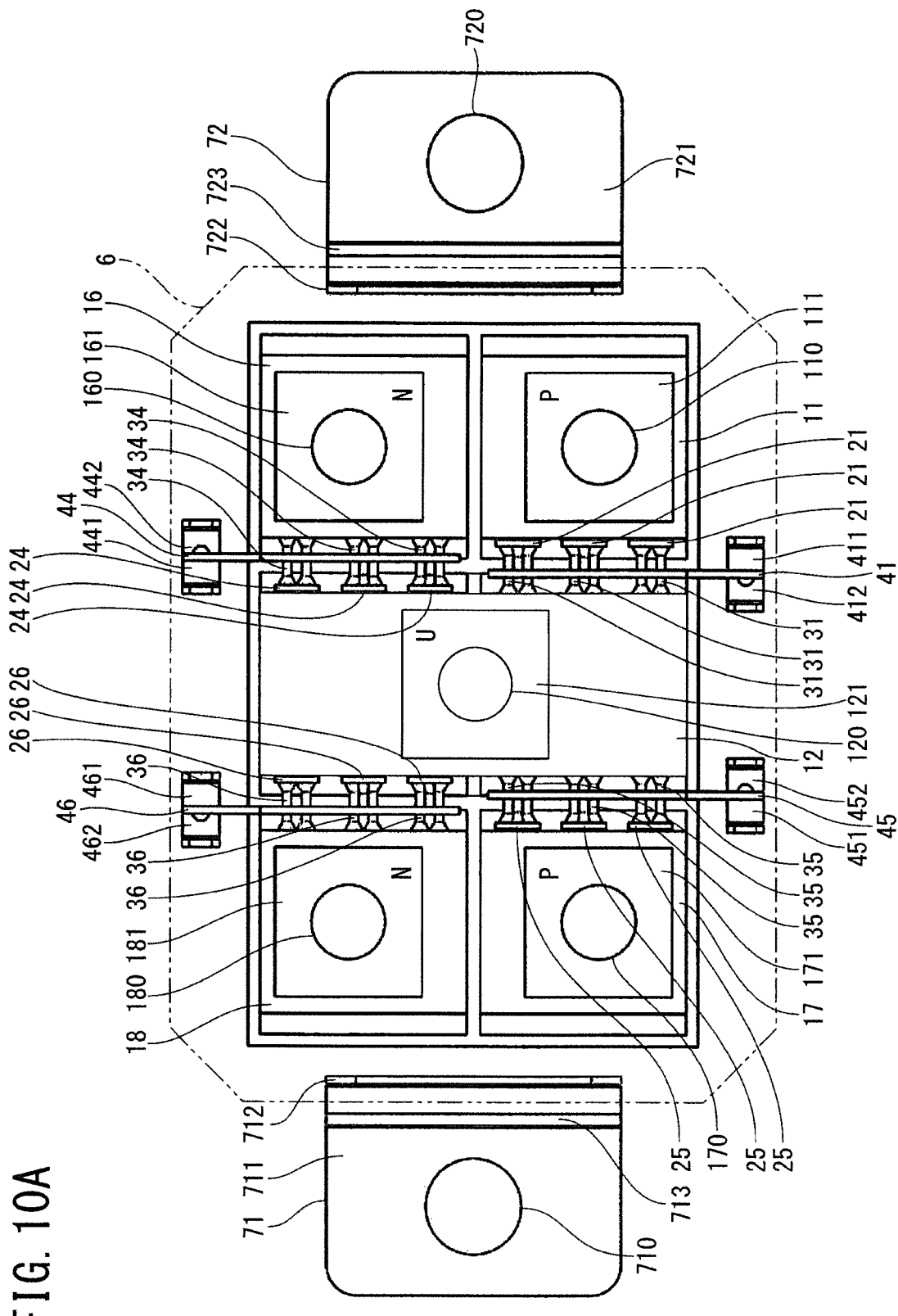
FIG. 10A is a top view illustrating another example of the internal configuration of the semiconductor device according to the third embodiment.

In the semiconductor device according to the third embodiment, the first semiconductor elements 21 and the fifth semiconductor elements 25 are connected in parallel to form an upper arm in the high-potential side, and the second semiconductor elements 24 and the sixth semiconductor elements 26 are connected in parallel to form a lower arm in the low-potential side. For example, the first P-terminal 11 and the third P-terminal 17 are connected to the high-potential side of the DC power supply, and the third N-terminal 18 and the second N-terminal 16 are connected to the low-potential side. And the first U-terminal 12 and the second U-terminal 15 are connected by the bus-bar and then, the bus-bar is connected to a load side. By such circuit topology, the semiconductor device according to the third embodiment can implement a half-bridge circuit including the first semiconductor elements 21 and the fifth semiconductor elements 25 as the upper arm and the second semiconductor elements 24 and the sixth semiconductor elements 26 as the lower arm. As described above, in the semiconductor device according to the third embodiment, the first U-terminal 12 and the second U-terminal 15 are connected by the bus-bar to be the same potential. Thus, as illustrated in FIG. 10A, only the first U-terminal 12 may be used without the second U-terminal 15. In such configuration of FIG. 10A, the second semiconductor elements 24 are mounted on the first connection face of the first U-terminal 12 and the sixth semiconductor elements 26 are mounted on the fifth connection face of the first U-terminal 12.

The auxiliary terminals (411, 451, 461, 441) conductively connected to the control electrodes of the first semiconductor elements 21, the fifth semiconductor elements 25, the sixth semiconductor elements 26 and the second semiconductor elements 24, respectively. And control signals are fed to the auxiliary terminals (411, 451, 461, 441), so that the first semiconductor elements 21 and the fifth semiconductor elements 25 which are the upper arm, and the sixth semiconductor elements 26 and the second semiconductor elements 24 which are as the lower arm, alternately repeat on and off.

FIGS. 11A, 11B, 11C, 11D illustrate the current changes in the semiconductor device of FIGS. 9 and 10 when the semiconductor elements of the upper arm and the semiconductor elements of the lower arm alternately turns on and off. Solid arrows indicate increasing current and dashed arrows indicate decreasing current. The on/off operation of the semiconductor elements is carried out in the order of FIG. 11A, FIG. 11B, FIG. 11C, and FIG. 11D, then returns to FIG. 11A, and thus, the cycle is repeated.

Figure 11A:
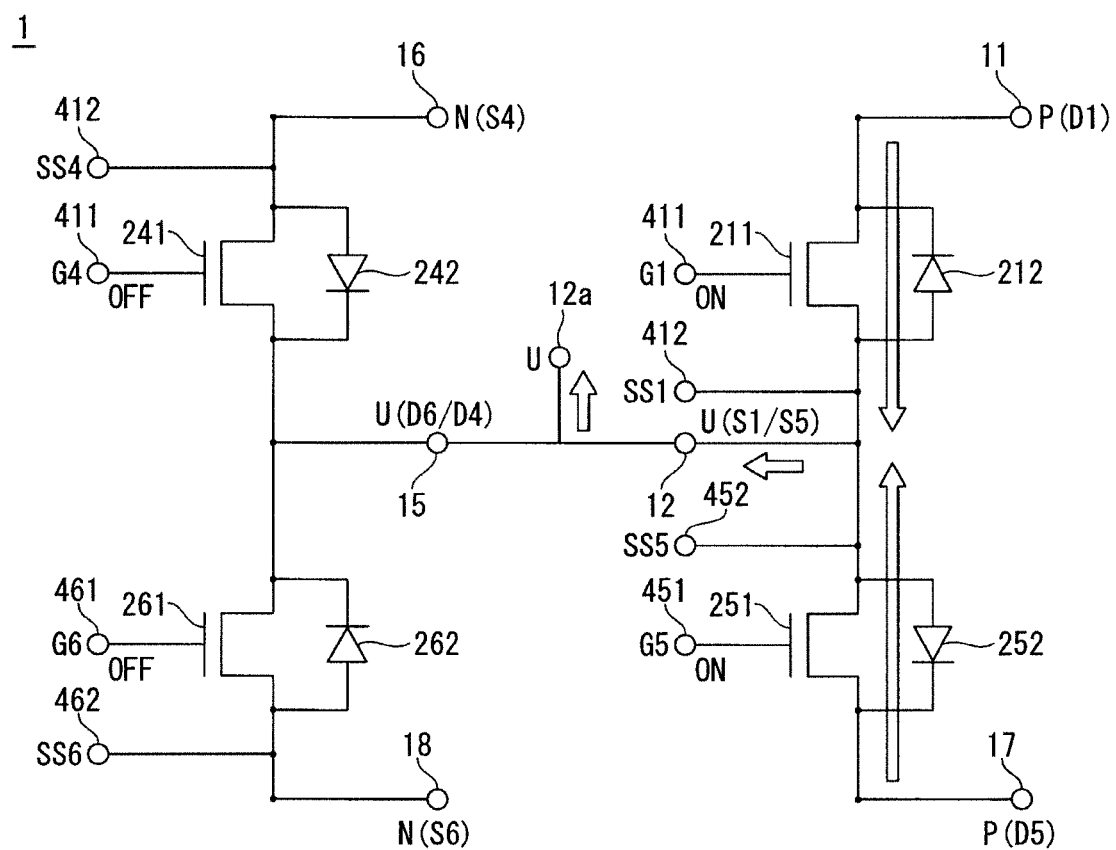
FIG. 11A is a circuit diagram (part 1) illustrating a temporal change of current flowing in the semiconductor device according to the third embodiment.

FIG. 11A illustrates a current change when the first semiconductor switching element 211 and the fifth semiconductor switching element 251 are turned on while the second semiconductor element 241 and the sixth semiconductor element 261 are turned off. As illustrated in FIG. 11A, current flowing from the first P-terminal (first main terminal) 11 to the mesa portion (second external-connection face) 121 of the first U-terminal (second main terminal) 12 through the first semiconductor switching element 211, and the first terminal pins 31, is increased. And also, current flowing from the third P-terminal (seventh main terminal) 17 to the mesa portion (second external-connection face) 121 of the first U-terminal (second main terminal) 12 through the fifth semiconductor switching element 251 and the fifth terminal pins 35, is increased.

Figure 11B:
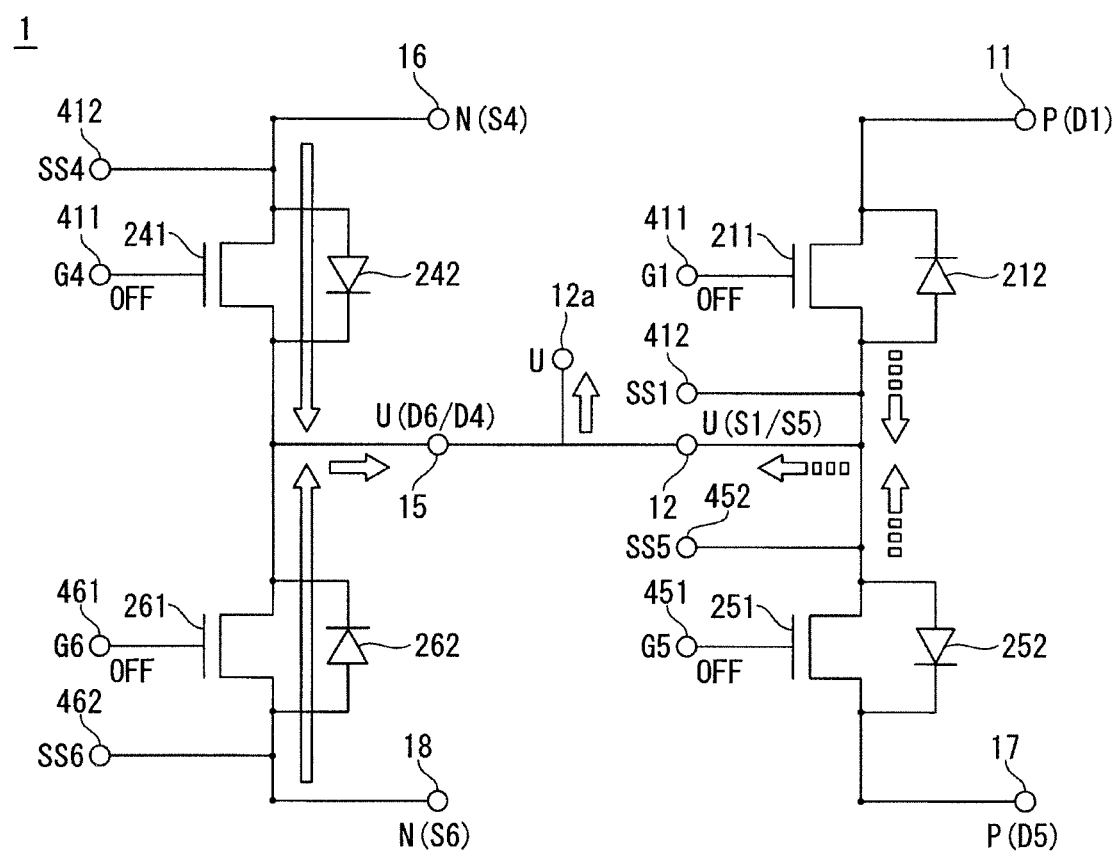
FIG. 11B is a circuit diagram (part 2) illustrating the temporal change of current flowing in the semiconductor device according to the third embodiment.

FIG. 11B illustrates a current change when the first semiconductor switching element 211 and the fifth semiconductor switching element 251 are turned off from the on state while the second semiconductor switching element 241 and the sixth semiconductor switching element 261 are turned off. As a flyback current to a coil of an external motor (not shown) connected to an external U-terminal 12a of a bus-bar, current flowing from the second N-terminal (fourth main terminal) 16 to the mesa portion (third external-connection face) 151 of the second U-terminal (third main terminal) 15 through the second diode 242 and the second terminal pins 34, is increased. At the same time, as a flyback current to the coil of the external motor (not shown) connected to the bus-bar, current flowing from the third U-terminal (eighth main terminal) 18 to the mesa portion (third external-connection face) 151 of the second U terminal (third main terminal) 15 through the sixth terminal pins 36 and the sixth diode 262, is increased. In addition, as a tail current of the first semiconductor switching element 211, current flowing from the first semiconductor switching element 211 to the mesa portion (second external-connection face) of the first U-terminal (second main terminal) 12 through the first terminal pins 31, is decreased. At the same time, as a tail current of the fifth semiconductor switching element 251, current flowing from the fifth semiconductor switching element 251 to the mesa portion (second external-connection face) of the first U-terminal (second main terminal) 12 through the fifth terminal pins 35, is decreased.

Therefore, the semiconductor device has a structure in which magnetic flux generated by the change in current between the second principal surface of the first semiconductor element 21 and the mesa portion (second external-connection face) 121 of the first U-terminal (second main terminal9 12, and magnetic flux generated by the change in current between the third principal surface of the second semiconductor element 24 and the mesa portion (third external-connection face) 151 of the second U-terminal (third main terminal) 15, cancel each other.

Figure 11C:
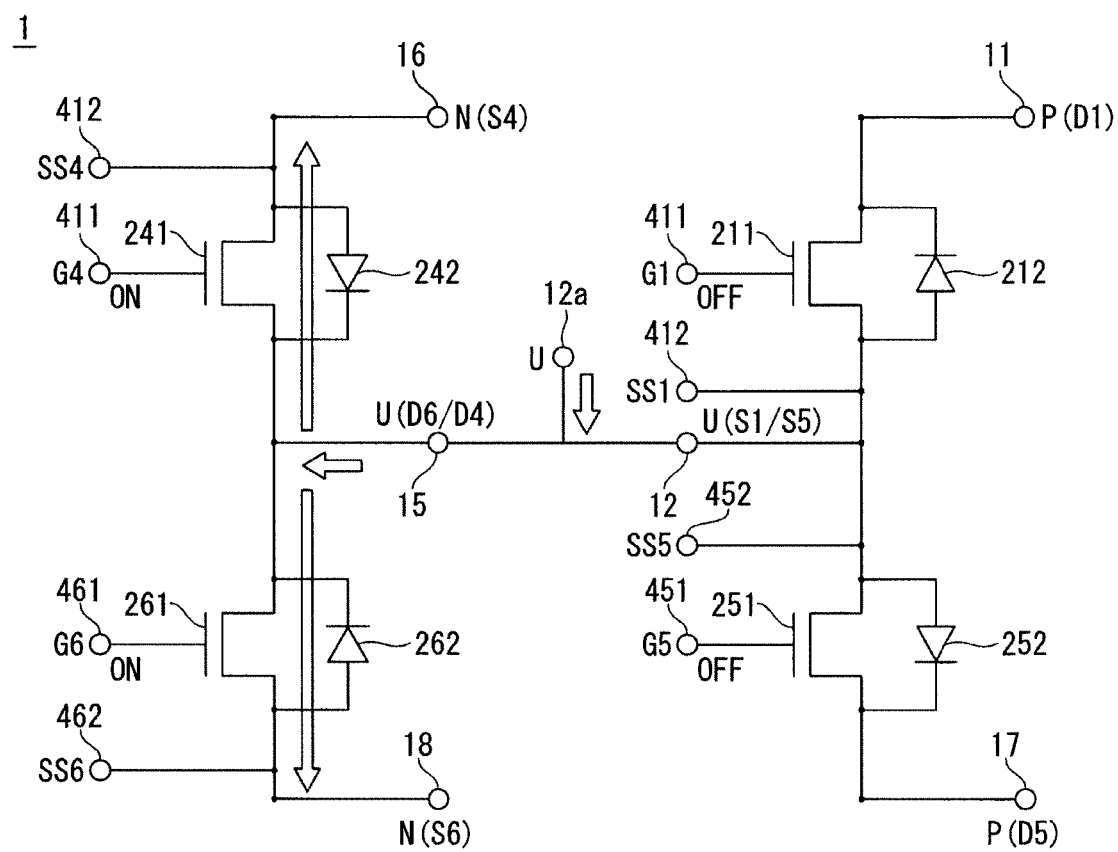
FIG. 11C is a circuit diagram (part 3) illustrating the temporal change of current flowing in the semiconductor device according to the third embodiment.

FIG. 11C illustrates a current change when the second semiconductor switching element 241 and the sixth semiconductor switching element 261 are turned on from the off state while the first semiconductor switching element 211 and the fifth semiconductor switching element 251 are turned off. As illustrated in FIG. 11C, current flowing from the second U-terminal (third main terminal) 15 to the second N-terminal (fourth main terminal) 16 through the second semiconductor switching element 241 and the second terminal pins 34, is increased. And also, current flowing from the second U-terminal (third main terminal) 15 to the third N-terminal (eighth main terminal) 18 through the sixth semiconductor switching element 261 and the sixth terminal pins 36, is increased.

Figure 11D:
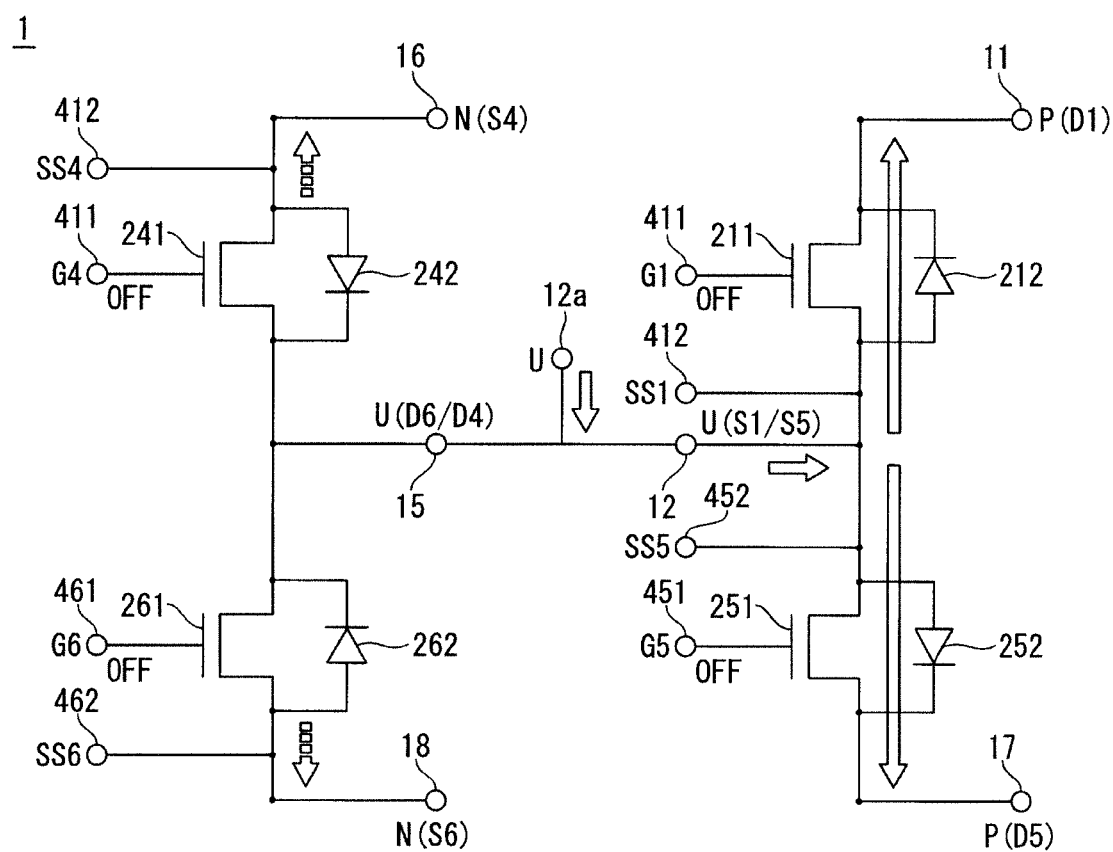
FIG. 11D is a circuit diagram (part 4) illustrating the temporal change of current flowing in the semiconductor device according to the third embodiment.

FIG. 11D illustrates a current change when the second semiconductor switching element 241 and the sixth semiconductor switching element 261 are turned off from the on state while the first semiconductor switching element 211 and the fifth semiconductor switching element 251 are turned off. As a flyback current from the coil of the external motor (not shown) connected to the first U-terminal (second main terminal) 12, current flowing from the first U-terminal (second main terminal) 12 to the first P-terminal (first main terminal) 11 through the first terminal pins 31 and the first diode 212, is increased. At the same time, as a flyback current from the coil of the external motor (not shown) connected to the first U-terminal (second main terminal) 12, current flowing from the first U-terminal (second main terminal) 12 to the third P-terminal (seventh main terminal) 17 through the fifth terminal pins 35 and the fifth diode 252, is increased. Further, as a tail current of the second semiconductor switching element 241, current flowing from the second semiconductor switching element 241 to the second N-terminal (fourth main terminal) 16 through the second terminal pins 34, is decreased. At the same time, as a tail current of the sixth semiconductor switching element 261, current flowing from the sixth semiconductor switching element 261 to the third N-terminal (eighth main terminal) 18 through the sixth terminal pins 36, is decreased.

Therefore, in the semiconductor device, the magnetic flux generated by the current change between the second principal surface of the first semiconductor element 21 (first diode 212) and the second external-connection face 121 of the second main terminal 12, and the magnetic flux generated by the current change between the third principal surface of the second semiconductor element 24 (second semiconductor switching element 241) and the third external-connection face 151 of the third main terminal 15, cancel each other. Also, in the semiconductor device, the magnetic flux generated by the current change between the ninth principal surface of the fifth semiconductor element 25 (fifth semiconductor switching element 251) and the seventh external-connection face 171 of the third P-terminal (seventh main terminal 17), and the magnetic flux generated by the current change between the twelfth principal surface of the sixth semiconductor element (sixth semiconductor switching element 261) and the eighth external-connection face 181 of the third N-terminal (eighth main terminal 18), cancel each other.

As described above, in the semiconductor device according to the third embodiment, the first P-terminal 11, the first U-terminal 12, and the third P-terminal (seventh main terminal) 17, and the second N-terminal 16, the second U-terminal 15, and the third N-terminal (eighth main terminal) 18 are disposed adjacent to and in parallel with each other while being separated from each other. Here, the upper arm is implemented by the first P-terminal 11, the first structure (21, 31, 41), the first U-terminal 12, the fifth structure (25, 35, 45) and the second P-terminal 17. And the lower arm is implemented by the second N-terminal 16, the sixth structure (26, 36, 46), the second. U-terminal 15, the sixth structure (26, 36, 46) and the third N-terminal 18. By connecting the first U-terminal 12 (second main terminal) and the second U-terminal 15 (third main terminal) by the bus-bar having the external U-terminal 12a, the first semiconductor element 21 and the fifth semiconductor element 25 in the upper arm are connected in parallel, and the second semiconductor element 24 and the sixth semiconductor element 26 in the lower arm are connected in parallel, and thus, a half-bridge circuit is formed. Then, the respective main terminals are arranged so that the currents flowing through the upper arm and the lower arm are substantially parallel and have change rates of the currents in opposite polarities, when the semiconductor switching elements in the half-bridge circuit are turned off from the on state. Therefore, in the semiconductor device according to the third embodiment, the magnetic fluxes generated due to the changes in the flowing currents are canceled each other. As a result, the inductance of the half bridge circuit can be reduced when the semiconductor switching elements are turned off from the on state.

The first P-terminal 11, the first U-terminal 12 and the third P-terminal 17, and the second N-terminal 16, the second U-terminal 15 and the third N-terminal 18 are effective to be as close as possible to each other. However, the closer the terminals are to one another, the more the insulation becomes problematic. In the semiconductor device according to the third embodiment, the case 6 is provided as a sealing resin to seal the assemblies implementing the half-bridge circuit in a state of being mounted on the cooling substrate 5 except for the bus bar connecting the first U terminal 12 (second main terminal) and the second U-terminal 15 (third main terminal), the upper surface of each main terminal, and the lower surface of the cooling substrate 5. Therefore, in the semiconductor device according to the third embodiment, since the spaces among the main terminals 11, 12, 15, 16, 17, 18 are filled with the resin material, it is possible to improve the insulating property and the mechanical strength.

The first P-terminal 11, the first U-terminal 12, and the third P-terminal 17, and the second N-terminal 16, the second U-terminal 15 and the third N-terminal 18 are effective to be as close as possible to each other. However, the closer the terminals are to one another, the more the insulation becomes problematic. In the semiconductor device according to the third embodiment, the case 6 is provided as a sealing resin to seal the assemblies implementing the first half-bridge circuit and the second half-bridge circuit in a state of being mounted on the cooling substrate 5, excluding the bus-bar connecting the first U-terminal 12 (second main terminal) and the second U-terminal 15 (third main terminal), the upper surface of each main terminal, and the lower surface of the cooling substrate 5. Therefore, in the semiconductor device according to the first embodiment, since the spaces among the main terminals 11, 12, 15, 16, 17, 18 are filled with the resin material, it is possible to improve the insulating property and the mechanical strength.

Further, since the semiconductor device according to the third embodiment uses block-shaped main terminals 11, 12, 17 16, 15, 18 having the screw holes 110, 120, 170, 160, 150, 180, respectively. And the connection with the bus-bar may be easy.

In particular, in the semiconductor device according to the third embodiment, the first P-terminal 11 and the second N-terminal 16 are disposed adjacent to each other, and the third P-terminal 17 and the third N-terminal 18 are disposed adjacent to each other. With such arrangement relationship, when the user connects the bus-bars in the device, it is possible to easily laminate a P-wiring and an N-wiring from the vicinity of the terminals via an insulating sheet, and also to suppress the inductance due to the wiring.

Further, in the semiconductor device according to the third embodiment, it is possible to provide a plurality of terminal pins to connect each of the semiconductor elements and the main terminal. By providing the terminal pins for each semiconductor element, the heat generated by each semiconductor element can be transferred to the opposite main terminal while securing the insulation between the main terminals. In addition, the displacement during joining the semiconductor element and the main terminal with the terminal pins may be prevented by using a high precision jig and a self-alignment technique in which the chip automatically moves to the optimum position when joining with a solder and the like.

As described above, the semiconductor device according to the third embodiment has a small size, low inductance, and high cooling capability.

Fourth Embodiment

While the present invention has been described above by reference to the embodiment, it should be understood that the present invention is not intended to be limited to the descriptions of the specification and the drawings implementing part of this disclosure. Various alternative embodiments, examples, and technical applications will be apparent to those skilled in the art according to this disclosure.

Figure 12:
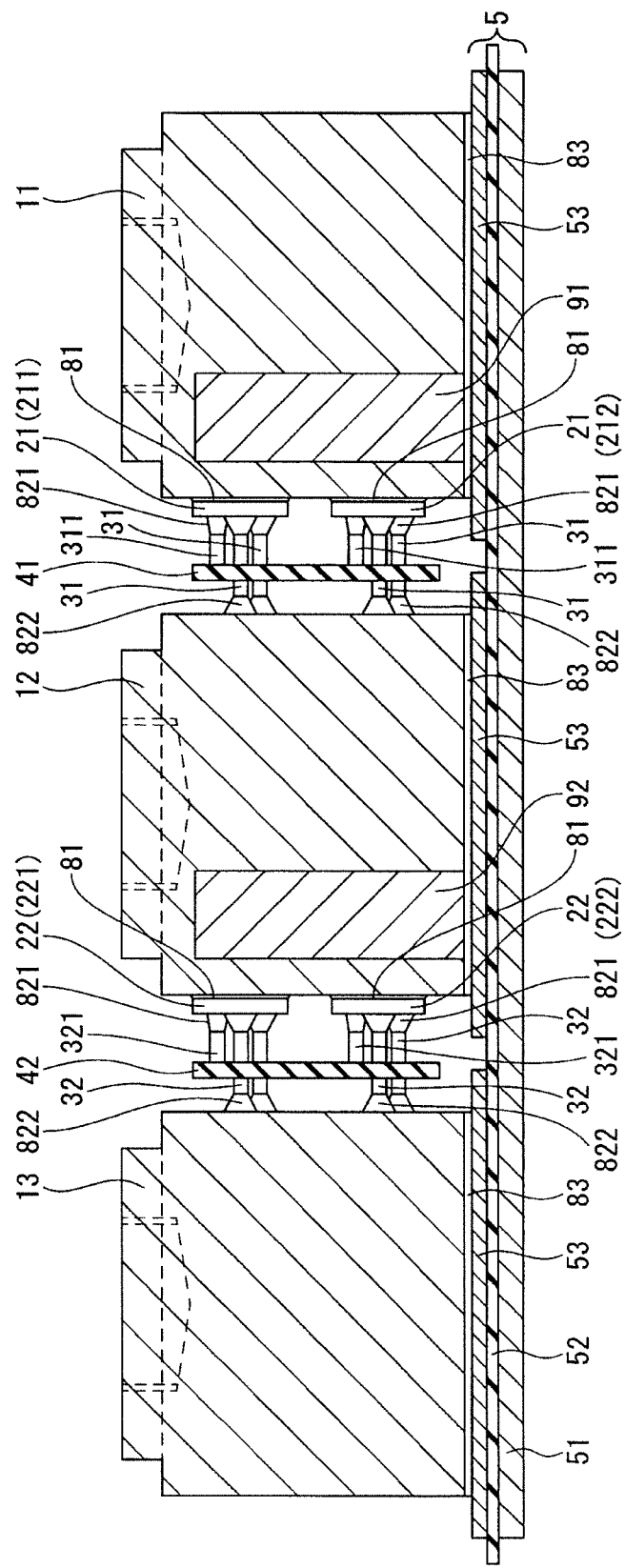
FIG. 12 is a cross-sectional view illustrating a semiconductor device according to a fourth embodiment.

For example, as already described in the first, second, and third embodiments, a member having a thermal conductivity higher than that of the main terminal in the vicinity of the internal mounting surface, may be provided to each main terminal on which the plural semiconductor elements are mounted, to further improve the cooling capability. For example, as illustrated in FIG. 12, inside the semiconductor device, a first heat-transfer portion 91 may be provided in the first P-terminal 11 toward the first cooling face from the vicinity of the first semiconductor switching element 211 (the first semiconductor element 21). Here, the first heat-transfer portion is made of a member having a thermal conductivity higher than that of the first P-terminal 11. Similarly, a second heat-transfer portion 92 may be provided inside the first U-terminal 12 from the vicinity of the third semiconductor switching element 221 (third semiconductor element 22) toward the second cooling face. Here, the second heat-transfer portion 92 is made of a member having a thermal conductivity higher than that of the first U-terminal 12. For example, a heat pipe, graphite, or the like can be adopted for the first heat-transfer unit 91 and the second heat-transfer unit 92.

In addition, although FIG. 12 illustrates the first heat-transfer portion 91 disposed inside the first P-terminal 11 and the second heat-transfer portion 92 disposed inside the first U-terminal 12, it is merely schematically illustrated as a representative example in a simplified manner. For example, in the first embodiment, a heat-transfer portion may be provided similarly to the inside of each of the second P-terminal 14 and the second U-terminal 15. In the third embodiment, two heat-transfer portions may be provided inside the second U-terminal 15 and in the vicinities of the second mounting face and the sixth mounting face, respectively. Further, the heat-transfer portion may be disposed in the vicinity of the connection face to which the terminal pins are connected, or may be disposed to the insides of all the main terminals.

Figure 13:
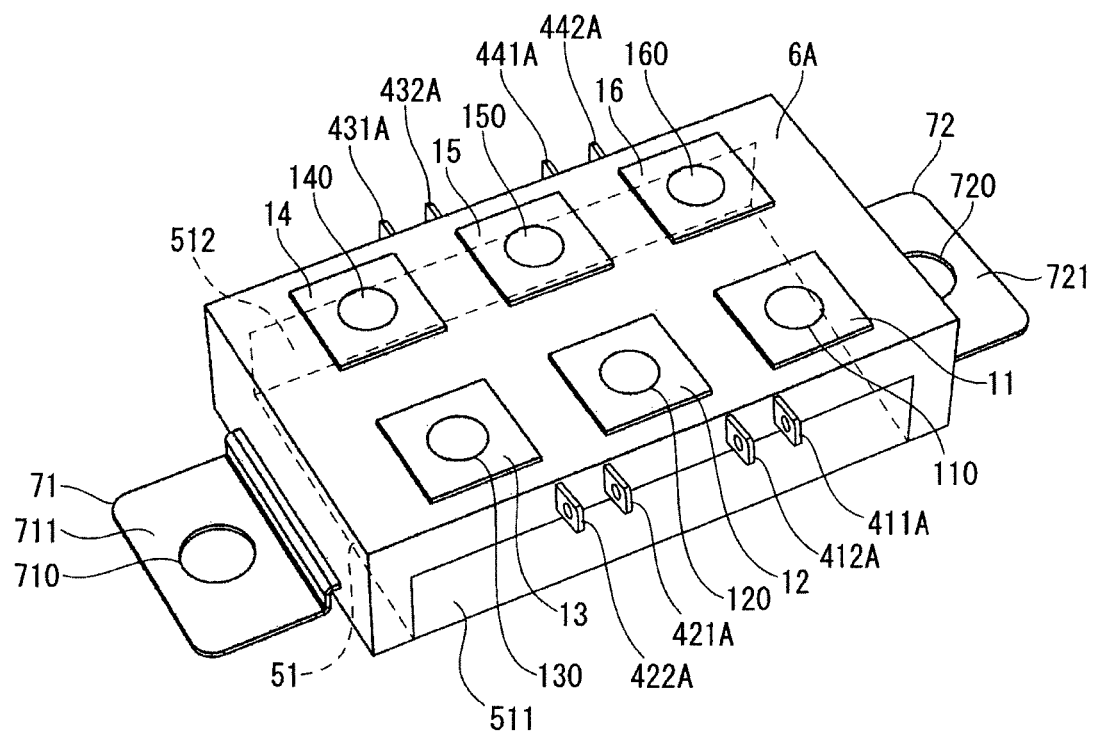
FIG. 13 is a perspective view illustrating the semiconductor device according to the fourth embodiment.

Further, as already described in the first, second and third embodiments, the cooling face exposed from the case 6 is not limited to the lower surface of the heat-transfer plate 51. For example, the cooling face may be provided on a side surface which is an end surface of the case 6 in the width direction. For example, as illustrated in FIG. 13, the semiconductor device may be provided with a first auxiliary cooling substrate 511 and a second auxiliary cooling substrate 512.

The first auxiliary cooling substrate 511 and the second auxiliary cooling substrate 512 are arranged to expose surfaces in end faces of a case 6A in a width direction. Therefore, the case 6A has a rectangular parallelepiped shape without the auxiliary portion 62, and each of a plurality of auxiliary terminals 411A, 412A, 421A, 422A, 431A, 432A, 441A, 442A protrudes outwards from upper parts of the end faces of the case 6A in the width direction. As in the case of the cooling substrate 5, for example, the first auxiliary cooling substrate 511 and the second auxiliary cooling substrate 512 may be a cooling substrate having terminal patterns divided on each side of each terminal on one surface of an insulating substrate, and a heat-transfer plate on the other surface of the insulating substrate to be exposed in side surfaces of the semiconductor device. In addition, the first auxiliary cooling substrate 511 and the second auxiliary cooling substrate 512 may be side surfaces of the cooling substrate 5 bent in a U-shape, and may be divided and disposed to correspond to the respective main terminals.

Further, as already described in the first, second and third embodiments, the single cooling substrate 5 is used. However, the cooling board is not limited to one. The cooling substrate 5 may be divided into two pieces corresponding to the first half-bridge circuit and the second half bridge circuit of the first embodiment or the upper arm side circuit and the lower arm side circuit of the third embodiment. Alternatively, the cooling substrate 5 may be divided into three or more corresponding to each main terminal. The cooling substrate 5 may be arbitrarily divided and deformed according to design requirements, such as manufacturing cost, mechanical strength, and the like.

Further, as already described in the first, second and third embodiments, the attachment portions 71, 72 may not have to be metal fittings made of a material different from that of the case 6 and may be integrally formed with the case 6. Furthermore, the attachment portions 71, 72 may be disposed on both sides of the case 6 in the width direction and may be more than two.

Further, as already described in the first, second and third embodiments, the auxiliary terminals are projected independently for each arm. However, the auxiliary terminals may be provided as interconnections connected to each other inside the case 6.

Further, as already described in the first and third embodiments, in order to rapidly reduce the tail current of the semiconductor switching element when the semiconductor switching element is turned off from the on state, the semiconductor switching elements and the diodes of the adjacent arms (for example, the first semiconductor element 21 and the second semiconductor element 24) may be alternately arranged. For example, in the first semiconductor element 21 and the second semiconductor element 24, the first semiconductor switching element 211 of the first semiconductor element 21 is disposed adjacent to the second diode 242 of the second semiconductor element 24. Then, the second semiconductor switching element 241 of the second semiconductor element 24 is disposed adjacent to the first diode 212 of the first semiconductor element 21. Thus, the current flowing through each of the first semiconductor element 21 and the second semiconductor element 24 may be further in parallel, and the inductance can be further reduced.

As described above, it should be noted that the present invention includes various embodiments which are not disclosed herein. Therefore, the scope of the present invention is defined only by the present invention specifying matters according to the claims reasonably derived from the description heretofore.

What is claimed is:

1. A semiconductor device, comprising:
   a first main terminal, which is polygonal-shaped, having a first external-connection face connected to a positive electrode on a top surface, a first cooling face on a bottom surface, and a side surface;
   a second main terminal, which is polygonal-shaped, having a second external-connection face on a top surface, a second cooling face on a bottom surface, and a side surface;
   a first semiconductor element having a first principal surface and a second principal surface opposite to the first principal surface, the first principal surface is electrically connected to the side surface of the first main terminal, and the second principal surface being electrically connected to the side surface of the second main terminal;
   a third main terminal, which is polygonal-shaped, having a third external-connection face on a top surface, a third cooling face on a bottom surface, and a side surface;
   a fourth main terminal, which is polygonal-shaped, having a fourth external-connection face connected to a negative electrode on a top surface, a fourth cooling face on a bottom surface, and a side surface;
   a second semiconductor element having a third principal surface and a fourth principal surface opposite to the third principal surface, the third principal surface being electrically connected to the side surface of the third main terminal, and the fourth principal surface being electrically connected to the side surface of the fourth main terminal; and
   a cooling substrate having an upper surface to which the first cooling face, the second cooling face, the third cooling face, and the fourth cooling face are joined, wherein
   the second main terminal and the third main terminal are disposed adjacent to each other while being separated, and the first main terminal and the fourth main terminal are disposed adjacent to each other while being separated.

2. The semiconductor device according to claim 1, wherein
   the first semiconductor element, which is a first semiconductor element group configured by a plurality of semiconductor elements, includes a first semiconductor switching element and a first diode connected in antiparallel with each other between the first main terminal and the second main terminal,
   the second semiconductor element, which is a second semiconductor element group configured by a plurality of semiconductor elements, includes a second semiconductor switching element and a second diode connected in antiparallel with each other between the third main terminal and the fourth main terminal, such that the second semiconductor switching element is connected in an opposite direction to the first semiconductor switching element and the second diode is connected in an opposite direction to the first diode.

3. The semiconductor device according to claim 2, wherein a magnetic flux generated by a change in current from the second principal surface of the first semiconductor element to the second external-connection face of the second main terminal, and a magnetic flux generated by a change in current from the third principal surface of the second semiconductor element to the third external-connection face of the third main terminal, cancel each other.

4. The semiconductor device according to claim 1, wherein currents flowing in forward directions of the first semiconductor element and the second semiconductor element are in opposite directions to each other.

5. The semiconductor device according to claim 1, wherein a first current from the second principal surface of the first semiconductor element to the second external-connection face of the second main terminal is in a same direction with a second current from the third principal surface of the second semiconductor element to the third external-connection face of the third main terminal, and a change rate of the first current has an opposite in polarity with a change rate of the second current.

6. The semiconductor device according to claim 1, further comprising:
   a first terminal pin electrically connecting the second principal surface of the first semiconductor element and the side surface of the second main terminal; and a second terminal pin electrically connecting the fourth principal surface of the second semiconductor element and the side surface of the fourth main terminal.

7. The semiconductor device according to claim 2, wherein the second main terminal and the third main terminal are electrically connected to each other,
the first semiconductor element implements an upper arm in a half-bridge circuit, and the second semiconductor element implements a lower arm in the half-bridge circuit.

8. The semiconductor device according to claim 1, further comprising:
a fifth main terminal, which is polygonal-shaped, having a fifth external-connection face connected to a negative electrode on a top surface, a fifth cooling face on a bottom surface, and a side surface;
a third semiconductor element having a fifth principal surface and a sixth principal surface opposite to the fifth principal surface, the fifth principal surface being electrically connected to the side surface of the second main terminal, and the sixth principal surface being electrically connected to the side surface of the fifth main terminal;
a sixth main terminal, which is polygonal-shaped, having a sixth external-connection face connected to a positive electrode on a top surface, a sixth cooling face on a bottom surface, and a side surface; and
a fourth semiconductor element having a seventh principal surface and an eighth principal surface opposed to the seventh principal surface, the seventh principal surface being electrically connected to the side surface of the sixth main terminal, and the eighth principal surface being electrically connected to the side surface of the third main terminal, wherein
the upper surface of the cooling substrate is joined to the fifth cooling face and the sixth cooling face, and the fifth
main terminal and the sixth main terminal are disposed adjacent to each other while being separated.

9. The semiconductor device according to claim 8, wherein a first magnetic flux generated by a first change in current from the fifth principal surface of the third semiconductor element to the second external-connection face of the second main terminal, and a second magnetic flux generated by a second change in current from the eighth principal surface of the fourth semiconductor element to the third external-connection face of the third main terminal, cancel each other.

10. The semiconductor device according to claim 9, further comprising:
a third terminal pin electrically connecting the sixth principal surface of the third semiconductor element and the side surface of the fifth main terminal; and
a fourth terminal pin electrically connecting the eighth main surface of the fourth semiconductor element and the side surface of the third main terminal.

11. The semiconductor device according to claim 1, further comprising:
a fifth main terminal, which is polygonal-shaped, having a fifth external-connection face connected to a positive electrode on a top surface, a fifth cooling face on a bottom surface, and a side surface;
a third semiconductor element having a fifth principal surface and a sixth principal surface opposite to the fifth principal surface, the fifth principal surface being electrically connected to the side surface of the fifth main terminal, and the sixth principal surface being electrically connected to the side surface of the second main terminal;
an sixth main terminal, which is polygonal-shaped, having an sixth external-connection face connected to a negative electrode on a top surface, an sixth cooling face on a bottom surface, and a side surface; and
a fourth semiconductor seventh having an eleventh principal surface and a seventh principal surface opposite to the seventh principal surface, the seventh principal surface being electrically connected to the side surface of the third main terminal, and the eighth principal surface being electrically connected to the side surface of the sixth main terminal, wherein
the upper surface of the cooling substrate is joined to the fifth cooling face and the sixth cooling face, and
the fifth main terminal and the sixth main terminal are disposed adjacent to each other while being separated.

12. The semiconductor device according to claim 11, wherein a first magnetic flux generated by a change in current from the sixth principal surface of the third semiconductor element to the second external-connection face of the second main terminal, and a second magnetic flux generated by a change in current from the seventh principal surface of the fourth semiconductor element to the third external-connection face of the third main terminal, cancel each other.

13. The semiconductor device according to claim 12, further comprising:
a third terminal pin electrically connecting the sixth principal surface of the third semiconductor element and the side surface of the second main terminal; and
a fourth terminal pin electrically connecting the eighth principal surface of the fourth semiconductor element and the side surface of the sixth main terminal.

14. The semiconductor device according to claim 1, wherein the first semiconductor element includes a control terminal, further comprising a printed circuit board connected with the control terminal and disposed between the first semiconductor element and the second main terminal.

15. The semiconductor device according to claim 1, further comprising a resin filled in at least a gap formed between main terminals among the first main terminal, the second main terminal, the third main terminal, and the fourth main terminal, to seal the first semiconductor element and the second semiconductor element.

16. The semiconductor device according to claim 1, wherein the cooling substrate includes an insulating substrate, a terminal pattern provided on an upper surface of the insulating substrate, and a heat transfer plate provided on a lower surface of the insulating substrate.

17. The semiconductor device according to claim 6, further comprising:
a plurality of first joining materials joining the first main terminal and the first semiconductor element and joining the first semiconductor element and the first terminal pin, respectively; and
a plurality of second joining materials joining the first main terminal and the cooling substrate and joining the second main terminal and the cooling substrate, respectively, the second joining materials having a lower melting point than the first joining materials.

18. The semiconductor device according to claim 1, further comprises a heat-transfer portion disposed from a vicinity of the first semiconductor element toward the first cooling surface inside the first main terminal, the heat-transfer portion having a higher heat conductivity than the first main terminal.

19. A semiconductor device, comprising:
- a positive-electrode terminal, which is polygonal-shaped, having an external-connection face connected to a positive electrode on a top surface, a cooling face on a bottom surface, and a side surface;
- an output-electrode terminal, which is polygonal-shaped, having an external-connection face on a top surface, a cooling face on a bottom surface, and a side surface;
- a first semiconductor element having a first principal surface and a second principal surface opposite to the first principal surface, the first principal surface is electrically connected to the side surface of the positive-electrode terminal, and the second principal surface being electrically connected to the side surface of the output-electrode terminal;
- a negative-electrode terminal, which is polygonal-shaped, having an external-connection face connected to a negative electrode on a top surface, a cooling face on a bottom surface, and a side surface;
- a second semiconductor element having a third principal surface and a fourth principal surface opposite to the third principal surface, the third principal surface being electrically connected to the side surface of the output-electrode terminal, and the fourth principal surface being electrically connected to the side surface of the negative-electrode terminal; and
- a cooling substrate having an upper surface to which the cooling face of the positive-electrode terminal, the cooling face of the output-electrode terminal, and the cooling face of the negative-electrode terminal are joined, wherein
- the positive-electrode terminal and the negative-electrode terminal are disposed adjacent to each other while being separated.

* * * * *